US012635464B2

(12) United States Patent
Lee et al.

(10) Patent No.: US 12,635,464 B2
(45) Date of Patent: *May 19, 2026

(54) APPARATUS FOR AND METHOD FOR ALIGNING DIPOLES AND METHOD OF FABRICATING DISPLAY DEVICE

(71) Applicant: SAMSUNG DISPLAY CO., LTD., Yongin-si (KR)

(72) Inventors: Won Ho Lee, Suwon-si (KR); Buem Joon Kim, Hwaseong-si (KR); Jong Hyuk Kang, Suwon-si (KR); Hyun Deok Im, Seoul (KR); Chung Sic Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 126 days.

This patent is subject to a terminal disclaimer.

(21) Appl. No.: 18/448,869

(22) Filed: Aug. 11, 2023

(65) Prior Publication Data

US 2023/0386878 A1      Nov. 30, 2023

Related U.S. Application Data

(62) Division of application No. 17/191,018, filed on Mar. 3, 2021, now Pat. No. 11,728,196.

(30) Foreign Application Priority Data

Jul. 1, 2020 (KR) ........................ 10-2020-0081036

(51) Int. Cl.
*H10P 72/50* (2026.01)
*B41J 2/095* (2006.01)
(Continued)

(52) U.S. Cl.
CPC .......... *H10P 72/50* (2026.01); *H10P 72/0448* (2026.01); *H10W 90/00* (2026.01);
(Continued)

(58) Field of Classification Search
CPC ................................ H01L 21/68; B41J 2/095
See application file for complete search history.

(56) References Cited

U.S. PATENT DOCUMENTS 5,975,680 A * 11/1999 Wen ........................... B41J 2/01
347/43
7,185,973 B2  3/2007 Gibson et al.
(Continued)

FOREIGN PATENT DOCUMENTS

EP      0721177 B1      4/2001
EP      3907082 A1      11/2021
(Continued)

OTHER PUBLICATIONS

International Search Report and Written Opinion, with English translation, corresponding to International Application No. PCT/KR2020/007232 dated Sep. 16, 2020 (13 pages).
(Continued)

*Primary Examiner* — Robert A Vetere
(74) *Attorney, Agent, or Firm* — Womble Bond Dickinson (US) LLP

(57) ABSTRACT

An apparatus for aligning dipoles is provided. The apparatus includes: an electric field forming unit including a stage and a probe unit, the probe unit being configured to form an electric field on the stage; an inkjet printing device including an inkjet head, the inkjet head being configured to spray ink including a solvent and dipoles dispersed in the solvent onto the stage; a light irradiation device configured to irradiate light onto the stage; and a temperature control device including a temperature control unit, the temperature control
(Continued)

unit being configured to control a temperature of the solvent sprayed on the stage.

9 Claims, 36 Drawing Sheets

(51) Int. Cl.

| | | |
|---|---|---|
| *H10P 72/00* | | (2026.01) |
| *H10W 72/00* | | (2026.01) |
| *H10W 90/00* | | (2026.01) |

(52) U.S. Cl.

CPC ........ *B41J 2/095* (2013.01); *H10W 72/07141* (2026.01); *H10W 72/07152* (2026.01); *H10W 72/07173* (2026.01); *H10W 72/07178* (2026.01); *H10W 72/07183* (2026.01)

(56) References Cited

U.S. PATENT DOCUMENTS

| | | | | |
|---|---|---|---|---|
| 8,828,763 | B1 * | 9/2014 | Lee | H10K 71/00 |
| | | | | 438/34 |
| 9,181,630 | B2 | 11/2015 | Shibata et al. | |
| 12,068,279 | B2 * | 8/2024 | Lee | H01L 21/67715 |
| 12,094,857 | B2 | 9/2024 | Jung et al. | |
| 2008/0272388 | A1 | 11/2008 | Ushiyama et al. | |
| 2015/0023643 | A1 | 1/2015 | Chartoff et al. | |
| 2018/0019369 | A1 * | 1/2018 | Cho | H01L 25/0753 |
| 2019/0214364 | A1 | 7/2019 | Kreuter et al. | |
| 2021/0083144 | A1 | 3/2021 | Xiang et al. | |

FOREIGN PATENT DOCUMENTS

| | | | |
|---|---|---|---|
| JP | H11-286113 | A | 10/1999 |
| JP | 2000-505918 | A | 5/2000 |
| JP | 2010-87452 | A | 4/2010 |
| JP | 2011-205060 | A | 10/2011 |
| JP | 2012-19241 | A | 1/2012 |
| KR | 10-2013-0033450 | A | 4/2013 |
| KR | 10-2014-0134967 | A | 11/2014 |
| KR | 10-2016-0066551 | A | 6/2016 |
| KR | 10-2017-0048311 | A | 5/2017 |
| KR | 10-2018-0007376 | A | 1/2018 |
| KR | 10-2018-0055021 | A | 5/2018 |
| KR | 10-2020-0031743 | A | 3/2020 |
| KR | 10-2020-0034898 | A | 4/2020 |
| KR | 10-2020-0034905 | A | 4/2020 |
| KR | 10-2020-0050000 | A | 5/2020 |
| KR | 10-2020-0102607 | A | 9/2020 |
| WO | 2011/111516 | A1 | 9/2011 |
| WO | WO 2021/020714 | A1 | 2/2021 |

OTHER PUBLICATIONS

U.S. Office Action dated May 5, 2023, issued in U.S. Appl. No. 17/630,595 (15 pages).

Extended European Search Report for European Application No. 20847623.4, dated Jul. 26, 2023 (3 pages).

Ex Parte Quayle Action dated Nov. 9, 2023, issued in U.S. Appl. No. 17/630,595 (7 pages).

U.S. Notice of Allowance dated Apr. 17, 2025, issued in U.S. Appl. No. 17/630,595 (10 pages).

* cited by examiner

RL2    SUB    770    RL4

SPRAY INK INCLUDING SOLVENT WITH
DIPOLES DISPERSED THEREIN ONTO
TARGET SUBSTRATE

S200

IRRADIATE LIGHT TO TARGET SUBSTRATE
WHILE CONTROLLING TEMPERATURE OF
TARGET SUBSTRATE AND ALIGN DIPOLES ON
TARGET SUBSTRATE BY FORMING ELECTRIC
FIELD ON TARGET SUBSTRATE

S300

REMOVE SOLVENT AND SETTLE DIPOLES ON
TARGET SUBSTRATE

DP 21    22    SUB

APPARATUS FOR AND METHOD FOR ALIGNING DIPOLES AND METHOD OF FABRICATING DISPLAY DEVICE

CROSS-REFERENCE TO RELATED APPLICATIONS

This application is a divisional of U.S. patent application Ser. No. 17/191,018, filed Mar. 3, 2021, which claims priority to and the benefit of Korean Patent Application No. 10-2020-0081036, filed Jul. 1, 2020, the entire content of both of which is incorporated herein by reference.

BACKGROUND

1. Field

Aspects of embodiments of the present disclosure relate to an apparatus for and method for aligning dipoles and a method of fabricating a display device.

2. Description of the Related Art

Display devices have become increasingly important with the development of multimedia, and various types (or kinds) of display devices, such as organic light-emitting diode (OLED) display devices, liquid crystal display (LCD) devices, and the like, have been developed.

A typical display device, which is a device for displaying (or configured to display) an image, includes a display panel, such as an OLED display panel or an LCD panel. The display panel may include light-emitting elements, such as light-emitting diodes (LEDs), and the LEDs may be (or may be classified as) OLEDs using (or including) an organic material as a fluorescent material or inorganic LEDs (ILEDs) using (or including) an inorganic material as a fluorescent material.

SUMMARY

Embodiments of the present disclosure provide an apparatus for aligning dipoles, which may include an inkjet printing device, a light irradiation device, and/or a temperature control device.

However, embodiments of the present disclosure are not limited to those set forth herein. The above and other embodiments of the present disclosure (and aspects and features thereof) will become more apparent to one of ordinary skill in the art to which the present disclosure pertains by referencing the detailed description of the present disclosure below.

According to an embodiment of the present disclosure, an apparatus for aligning dipoles is provided. The apparatus includes: an electric field forming unit including a stage and a probe unit, the probe unit being configured to form an electric field on the stage; an inkjet printing device including an inkjet head, the inkjet head being configured to spray ink including a solvent and dipoles dispersed in the solvent onto the stage; a light irradiation device configured to irradiate light onto the stage; and a temperature control device including a temperature control unit, the temperature control unit being configured to control a temperature of the solvent sprayed on the stage.

The temperature control unit may be configured to control the temperature of the solvent by controlling a temperature of a substrate on the stage.

The temperature control unit may include a heater to heat the substrate.

The temperature control unit may further include a cooler to cool the substrate.

The temperature control device may further include a temperature sensor to detect the temperature of the substrate.

The light irradiation device may irradiate the light onto the stage after the spraying of the ink onto the stage, and the temperature control unit may control the temperature of the substrate while the light is being irradiated onto the stage.

The electric field forming unit may form the electric field on the stage while the light is being irradiated onto the stage.

The temperature control unit may be below the stage and may control the temperature of the solvent by controlling a temperature of the stage.

According to another embodiment of the present disclosure, an apparatus for aligning dipoles is provided. The apparatus has a printing part, a heat treatment part, and a transfer part between the printing part and the heat treatment part. The apparatus includes: an electric field forming unit including a stage and a probe unit, the probe unit being configured to form an electric field on the stage; an inkjet printing device in the printing part and including an inkjet head, the inkjet head being configured to spray ink including a solvent and dipoles dispersed in the solvent onto the stage; a light irradiation device configured to irradiate light onto the stage; a temperature control device including a temperature control unit, the temperature control unit being configured to control a temperature of the solvent sprayed on the stage; and a heat treatment device in the heat treatment part and configured to apply heat onto the stage.

The light irradiation device and the temperature control device may be in the printing part, the light irradiation device may irradiate the light onto the stage after the spraying of the ink onto the stage, and the temperature control unit may control the temperature of the solvent while the light is being irradiated onto the stage.

The electric field forming unit may form the electric field on the stage while the light is being irradiated onto the stage.

The light irradiation device and the temperature control device may be in the heat treatment part, the light irradiation device may irradiate the light onto the stage before the heat treatment device applies the heat onto the stage, and the temperature control unit may control the temperature of the solvent while the light is being irradiated onto the stage.

The electric field forming unit may form the electric field on the stage while the light is being irradiated onto the stage.

The apparatus may further include a transfer unit in the transfer part and configured to move the electric field forming unit from the printing part to the heat treatment part.

The light irradiation device and the temperature control device may be in the transfer part, the light irradiation device may irradiate the light onto the stage while the transfer unit moves the electric field forming unit, and the temperature control unit may control the temperature of the solvent while the light is being irradiated onto the stage.

The temperature control unit may control the temperature of the solvent by controlling a temperature of a substrate on the stage.

According to another embodiment of the present disclosure, a method of aligning dipoles is provided. The method includes: spraying ink, including a solvent and dipoles dispersed in the solvent, onto a target substrate; and irradiating light onto the target substrate while controlling a temperature of the target substrate and aligning the dipoles on the target substrate by forming an electric field on the target substrate.

The aligning of the dipoles on the target substrate may include heating the target substrate so that a temperature of the solvent sprayed on the target substrate increases and a viscosity of the solvent decreases.

The light irradiated to the target substrate may be applied to the dipoles so that a dipole moment of the dipoles increases.

The light may be irradiated onto the target substrate while the temperature of the target substrate is controlled and while the electric field is formed on the target substrate.

The method may further include removing the solvent sprayed on the target substrate and settling the dipoles on the target substrate.

According to another embodiment of the present disclosure, a method of fabricating a display device is provided. The method includes: spraying ink including a solvent and light-emitting elements dispersed in the solvent onto a base substrate, the base substrate having first and second electrodes thereon; and irradiating light onto the base substrate while controlling a temperature of the base substrate and aligning the light-emitting elements between the first and second electrodes by forming an electric field on the base substrate.

The aligning of the light-emitting elements may include heating the base substrate so that a temperature of the solvent sprayed on the base substrate increases and a viscosity of the solvent decreases.

The light irradiated onto the base substrate may be applied to the light-emitting elements so that a dipole moment of the light-emitting elements increases.

According to the aforementioned and other embodiments of the present disclosure, an apparatus for aligning dipoles, including an inkjet printing device, an electric field forming unit, a light irradiation device, and a temperature control device, can control (e.g., can accurately control) the temperature of a target substrate, can irradiate light to ink including dipoles and a solvent having the dipoles dispersed therein, and can form an electric field. When the temperature of the target substrate increases, the temperature of the solvent sprayed on the target substrate may increase, and the viscosity of the solvent may decrease. Thus, as the viscosity of the solvent decreases, the flow of the dipoles dispersed in the solvent can be facilitated (or improved), and as a result, the degree of alignment of the dipoles can be improved. Also, as light is irradiated onto the dipoles, the alignment reactivity of the dipoles can be improved, and the dipoles can be aligned on the target substrate with a high degree of alignment due to the presence of the electric field.

Other aspects and features of embodiments of the present disclosure may be apparent from the following detailed description, the drawings, and the claims.

BRIEF DESCRIPTION OF THE DRAWINGS

The above and other aspects and features of the present disclosure will become more apparent by describing, in detail, embodiments thereof with reference to the attached drawings, in which:

FIG. 5 is a plan view of an electric field forming unit according to an embodiment of the present disclosure;

FIGS. 6 and 7 illustrate the operation of a probe unit according to an embodiment of the present disclosure;

FIG. 10 is a partial plan view of the apparatus shown in FIG. 1;

FIG. 12 is a cross-sectional view illustrating the operation of a heat treatment unit according to an embodiment of the present disclosure;

FIG. 13 illustrates ink being ejected from an inkjet head according to the embodiment shown in FIG. 3;

FIG. 14 illustrates ink being ejected from an inkjet head according to another embodiment of the present disclosure;

FIG. 15 is a cross-sectional view illustrating a dipole alignment process according to an embodiment of the present disclosure;

FIGS. 20 through 23 illustrate alignment of dipoles by using the apparatus shown in FIG. 1;

FIGS. 24 through 27 are partial cross-sectional views of apparatuses for aligning dipoles according to other embodiments of the present disclosure;

FIG. 33 is a cross-sectional view taken along the line Q-Q' of FIG. 32;

DETAILED DESCRIPTION

Figure 1:
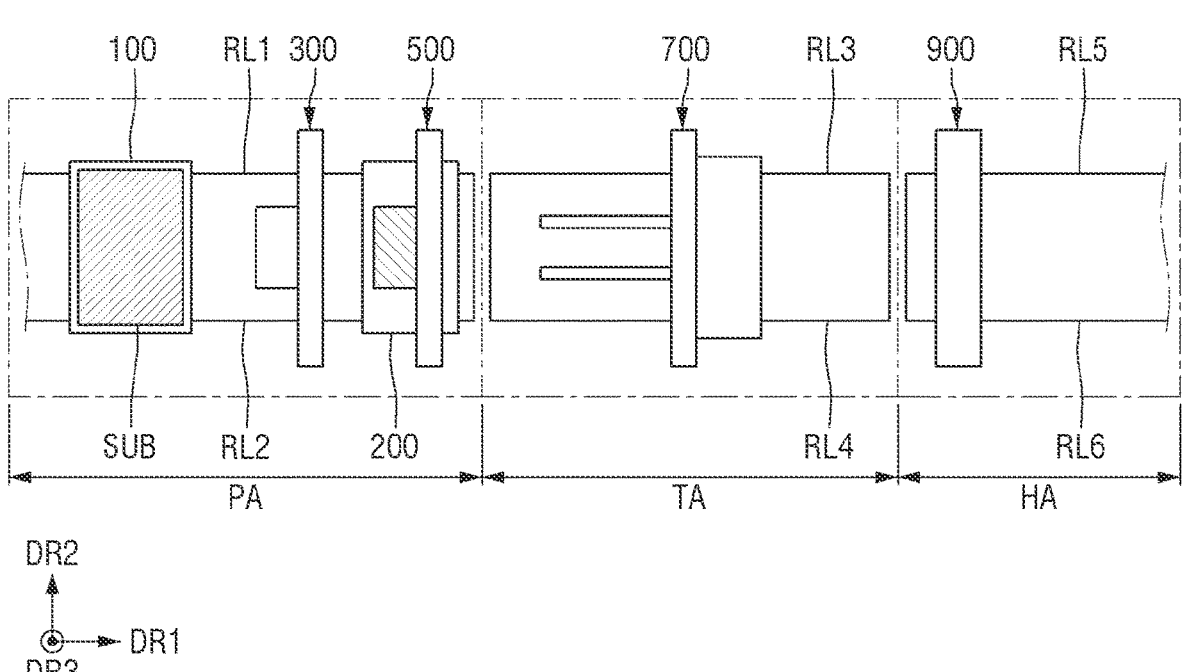
FIG. 1 is a plan view of an apparatus for aligning dipoles according to an embodiment of the present disclosure.

The present disclosure will now be described more fully hereinafter with reference to the accompanying drawings, in which example embodiments of the disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate or intervening layers may be present. When a layer is referred to as being "directly on" another layer or substrate, there are no intervening layers present.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Embodiments of the present disclosure will hereinafter be described with reference to the accompanying drawings.

FIG. 1 is a plan view of an apparatus for aligning dipoles according to an embodiment of the present disclosure.

An apparatus 1000 for aligning dipoles may spray ink including dipoles and a solvent having the dipoles dispersed therein onto a target substrate and may align the dipoles on the target substrate. The apparatus 1000 may settle the dipoles on the target substrate by removing the solvent from the target substrate. The apparatus 1000 may control the temperature of the target substrate during the alignment of the dipoles by irradiating light to the target substrate. Because the temperature of the target substrate is (or can be) controlled during the alignment of the dipoles by, for example, the apparatus 1000, the temperature and the viscosity of the solvent sprayed on the target substrate may be controlled, and as a result, the degree of alignment of the dipoles is improved.

Referring to FIG. 1, the apparatus 1000 may include a printing part (e.g., a printing area) PA, a transfer part (e.g., a transfer area) TA, and a heat treatment part (e.g., a heat treatment area) HA.

The printing part PA may be a region where the ink I is sprayed (see, e.g., FIG. 3), the ink including dipoles DP (see, e.g., FIG. 13) and a solvent SV (see, e.g., FIG. 13) having the dipoles DP dispersed therein. For example, the printing part PA may be a region at where a printing process that sprays the ink I onto a target substrate SUB is to be performed.

The heat treatment part HA may be disposed to be spaced apart from the printing part PA. The heat treatment part HA may be region at where the solvent SV is removed from the target substrate SUB through the application of heat to the target substrate SUB with the ink I sprayed thereon.

The transfer part TA may be disposed between the printing part PA and the heat treatment part HA. The transfer part TA may be a region at where and by which the target substrate SUB is transferred from the printing part PA to the heat treatment part HA after the printing process.

The apparatus 1000 may perform a dipole alignment process that aligns the dipoles DP on (e.g., sprayed on) the target substrate SUB. The dipole alignment process may be performed in at least one of the printing part PA, the heat treatment part HA, and the transfer part TA.

The apparatus 1000 may further include an electric field forming unit 100, an inkjet printing device 300, a light irradiation device 500, and a temperature control device 200. In some embodiments, the apparatus 1000 may further include a transfer unit 700 and a heat treatment device 900.

The inkjet printing device 300 may be disposed in the printing part PA. The inkjet printing device 300 may be disposed in the printing part PA to print the ink I onto the target substrate SUB. The inkjet printing device 300 may spray the ink I onto the target substrate SUB while the apparatus 1000 is being driven.

The transfer unit 700 may be disposed in the transfer part TA. Once a printing process performed by the inkjet printing device 300 is complete, the transfer unit 700 may move the target substrate SUB from the printing part PA to the heat treatment part HA.

The heat treatment device 900 may be disposed in the heat treatment part HA. The heat treatment device 900 may remove (or substantially remove) the solvent SV on (e.g., sprayed onto) the target substrate SUB by generating heat in (or around) the target substrate SUB. For example, the solvent SV on the target substrate SUB may be removed by thermal energy generated by the heat treatment device 900.

The apparatus 1000 may spray the ink I onto the target substrate SUB via the inkjet printing device 300, which is disposed in the printing part PA. The target substrate SUB with the ink I sprayed thereon may be moved from the printing part PA to the heat treatment part HA by the transfer unit 700, which is disposed in the transfer part TA, the dipoles DP may be aligned by removing the solvent SV on the target substrate SUB (or as the solvent SV is removed from the target substrate SUB) via the heat treatment device 900, which is disposed in the heat treatment part HA.

As described above, the apparatus 1000 may spray the ink I onto the target substrate SUB by using the inkjet printing device 300, which is disposed in the printing part PA, and may then perform the dipole alignment process that aligns the dipoles DP included (or suspended) in the ink I.

The dipole alignment process may be performed by using the electric field forming unit 100, the light irradiation device 500, and/or the temperature control device 200.

The electric field forming unit 100 may provide space in which the target substrate SUB is to be disposed (e.g., the electric field forming unit 100 may have an area therein to accommodate the target substrate SUB). Also, the electric field forming unit 100 may form an electric field on (or around) the target substrate SUB during the dipole alignment process. The electric field formed by the electric field forming unit 100 may be transmitted (or imparted) to the ink I sprayed on the target substrate SUB. The alignment direction of the dipoles DP may be controlled so that the dipoles DP may be aligned in one direction on the target substrate SUB by imparting an electric force onto the dipoles DP included in the ink I.

The light irradiation device 500 may improve the alignment reactivity of the dipoles DP by irradiating light to the ink I sprayed on the target substrate SUB to improve the dipole moment of the dipoles DP.

The temperature control device 200 may control the temperature of the target substrate SUB during the dipole alignment process. The temperature control device 200 may control the temperature of the target substrate SUB and may thereby indirectly control the temperature of the solvent SV sprayed on the target substrate SUB. The viscosity of the solvent SV may vary depending on the temperature of the solvent SV. Thus, the viscosity of the solvent SV can be indirectly controlled by controlling the temperature of the solvent SV by controlling the temperature of the target substrate SUB by using the temperature control device 200. As the viscosity of the solvent SV decreases, the rotation (or the flow) of the dipoles DP that are in an electric field and receive the same (or substantially the same) amount of electric force can be facilitated (e.g., improved), and as a result, the degree of alignment of the dipoles DP can be improved.

The dipole alignment process may be performed in at least one of the printing part PA, the transfer part TA, and the heat treatment part HA. FIG. 1 illustrates the apparatus 1000 in which the light irradiation device 500 and the temperature control device 200, which used in the dipole alignment process, are disposed in the printing part PA, but the present disclosure is not limited thereto. In other embodiments, the light irradiation device 500 and the temperature control device 200 may be disposed in at least one of the transfer part TA and the heat treatment part HA, and such an embodiment will be described in more detail below.

First, second, and third directions DR1, DR2, and DR3 are as defined in the accompanying drawings of the apparatus 1000. The first and second directions DR1 and DR2 may be directions that are on the same plane and are orthogonal to each other, and the third direction DR3 may be a direction perpendicular to the first and second directions DR1 and DR2. For example, the first and second directions DR1 and DR2 may be understood as being a rightward direction and an upward direction, respectively, in a plan view of, for example, FIG. 1, and the third direction DR3 may be understood as being an upward direction in a cross-sectional view of, for example, FIG. 3.

FIG. 1 is a schematic plan view of the apparatus 1000 as viewed from thereabove and illustrates the arrangement and operation of the elements of the apparatus 1000, but the structures and the arrangement of the elements of the apparatus 1000 are not limited to that which is illustrated in FIG. 1. For example, the apparatus 1000 may include more elements than those illustrated in FIG. 1 and may have a different structure (or arrangement) from that illustrated in FIG. 1. The configuration and the operation of the apparatus 1000 will hereinafter be described with reference to FIG. 1 and other drawings.

Figure 2:
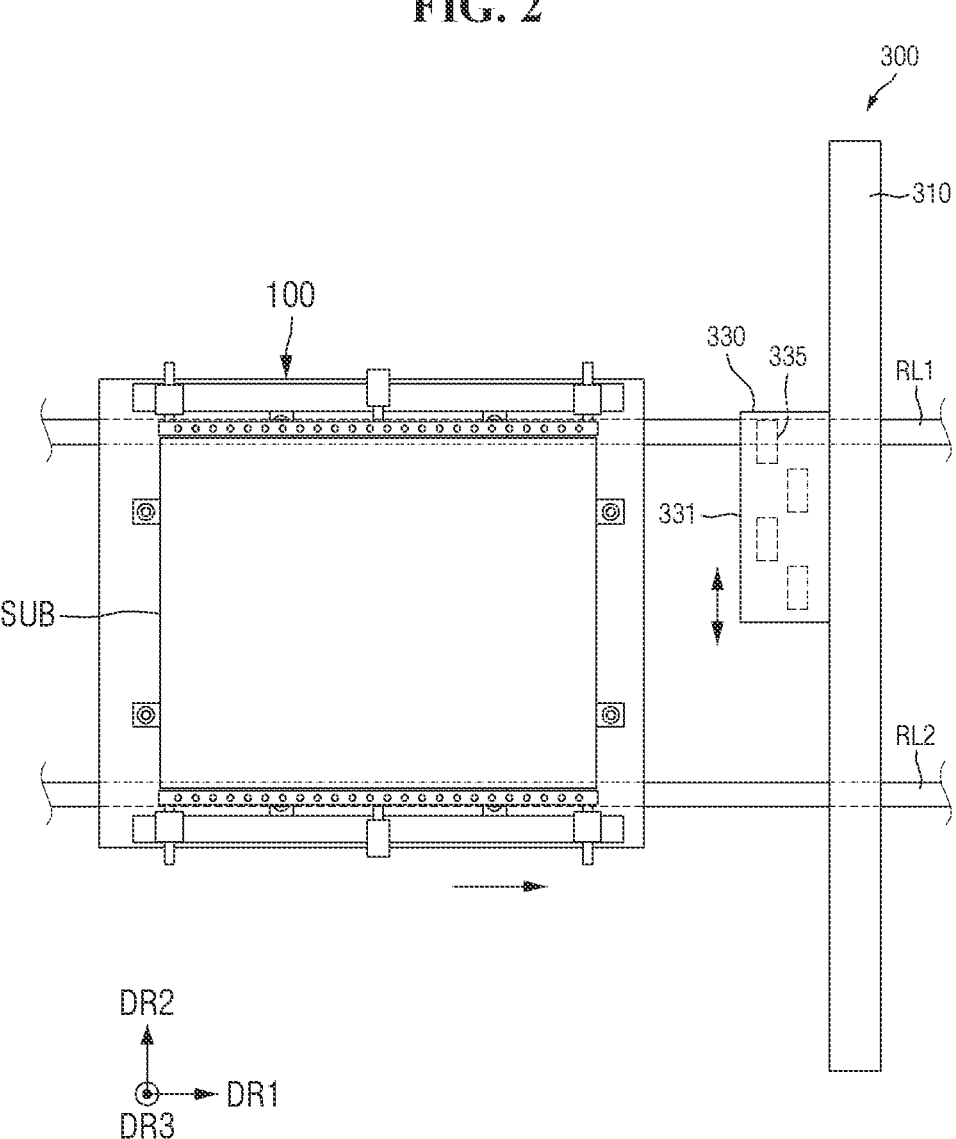
FIG. 2 is a layout view illustrating an electric field forming unit and an inkjet printing device disposed in a printing unit of the apparatus shown in FIG. 1.
Figure 3:
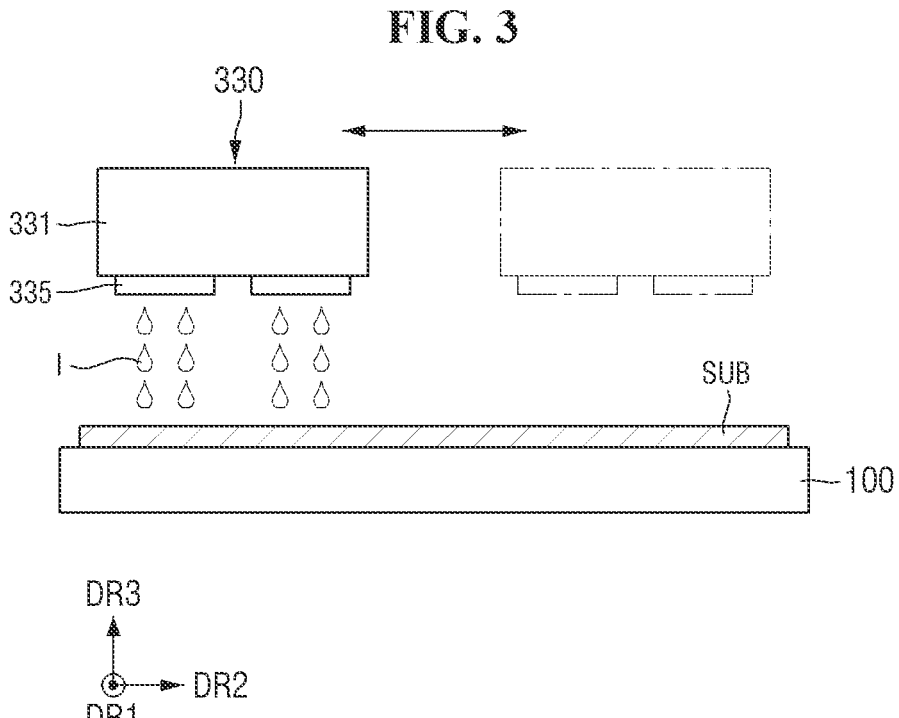
FIG. 3 illustrates the operation of an inkjet head unit according to an embodiment of the present disclosure.
Figure 4:
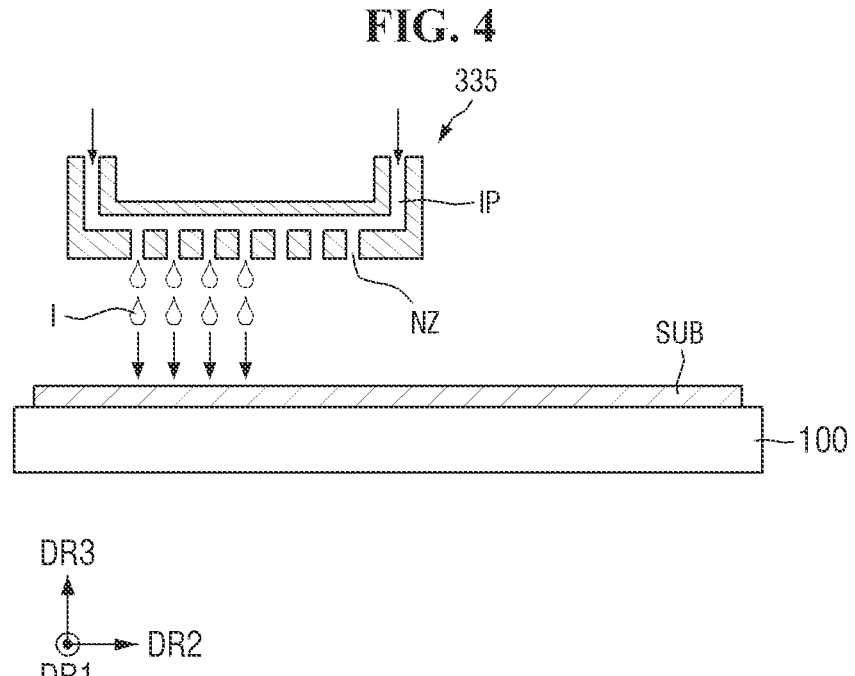
FIG. 4 illustrates ink being ejected from an inkjet head shown in FIG. 3.

FIG. 2 is a layout view illustrating the electric field forming unit 100 and the inkjet printing device 300 in the printing unit PA of the apparatus 1000 shown in FIG. 1. FIG. 3 illustrates the operation of an inkjet head unit according to an embodiment of the present disclosure. FIG. 4 illustrates the ejection of ink from an inkjet head shown in FIG. 3.

Referring to FIGS. 1 through 4, the inkjet printing device 300 and first and second rails RL and RL2 may be disposed in the printing part PA of the apparatus 1000.

The first and second rails RL1 and RL2 may be disposed in the printing part PA and may extend in the first direction DR1. The electric field forming unit 100 may be disposed on the first and second rails RL1 and RI2. The electric field forming unit 100 may move in the first direction DR1 along the first and second rails RL1 and RL2 via separate moving devices. The ink I may be sprayed onto the target substrate SUB in the electric field forming unit 100 as it passes through the inkjet printing device 300 by moving in the first direction DR1.

The apparatus 1000 may further include a base frame, which is disposed on the first and second rails RL1 and RL2 in the printing part PA and provides a region on which the electric field forming unit 100 may be disposed.

The inkjet printing device 300 may include a first support 310 and an inkjet head unit 330. The inkjet printing device 300 may further include an ink storage.

The inkjet head unit 330 may be mounted on the first support 310. The inkjet head unit 330 may be variously disposed on the first support 310 as would be understood by one skilled in the art. For example, the inkjet head unit 330 may be disposed directly on the first support 310 or may be mounted on, or coupled to, the first support 310 via separate coupling devices.

The inkjet head unit 330 may be connected to the ink storage and may thus be provided with the ink I from the ink storage. The inkjet head unit 330 may spray the ink I provided from the ink storage onto the target substrate SUB provided on the electric field forming unit 100.

The inkjet head unit 330 may spray the ink I onto the target substrate SUB while moving (e.g., while the inkjet head unit 330 moves) in the second direction DR2, which is the extension direction of the first support 310. In some embodiments, the width, in the second direction DR2, of the target substrate SUB may be greater than the width, in the second direction DR2, of the inkjet head unit 330. The inkjet head unit 330 may spray the ink I onto the entire target substrate SUB while moving in the second direction DR2.

The inkjet head unit 330 may include a head base 331 and inkjet heads 335 disposed on a surface of the head base 331.

The head base 331 may be mounted on the first support 310. The head base 331 may extend in the second direction DR2. The head base 331 may be spaced apart, in the third direction DR3, from the electric field forming unit 100 that passes below the first support 310. The head base 331 may further include moving devices and may, thus, move in the second direction DR2 over (or along) the first support 310.

A plurality of inkjet heads 335 may be disposed on the surface of the head base 331, for example, on a bottom surface of the head base 331. The inkjet heads 335 may be disposed to be spaced apart from one another. The inkjet heads 335 may be arranged in one or more rows in a plan view. In FIG. 2, the inkjet heads 335 are illustrated as being arranged in two rows in a staggered manner, but the arrangement and the number of inkjet heads 335 are not particularly limited. For example, 128 to 1800 inkjet heads 335 may be provided in one inkjet head unit 330, but the present disclosure is not limited thereto.

Each of the inkjet heads 335 may include a plurality of nozzles NZ and an inner tube (e.g., inner pipe) IP. The nozzles NZ, which are disposed at the bottom surface of the corresponding inkjet head 335, may be connected to (e.g., may be in fluid communication with) the inner tube IP of the corresponding inkjet head 335. Each of the inkjet heads 335 may be provided with the ink I from the head base 331 through the inner tube IP thereof, and the ink I may be sprayed through the nozzles NZ of each of the inkjet heads 335 while flowing along the inner tube IP of each of the inkjet heads 335. The ink I may be sprayed onto the target substrate SUB provided on the electric field forming unit 100 through the nozzles NZ of each of the inkjet heads 335.

Figure 5:
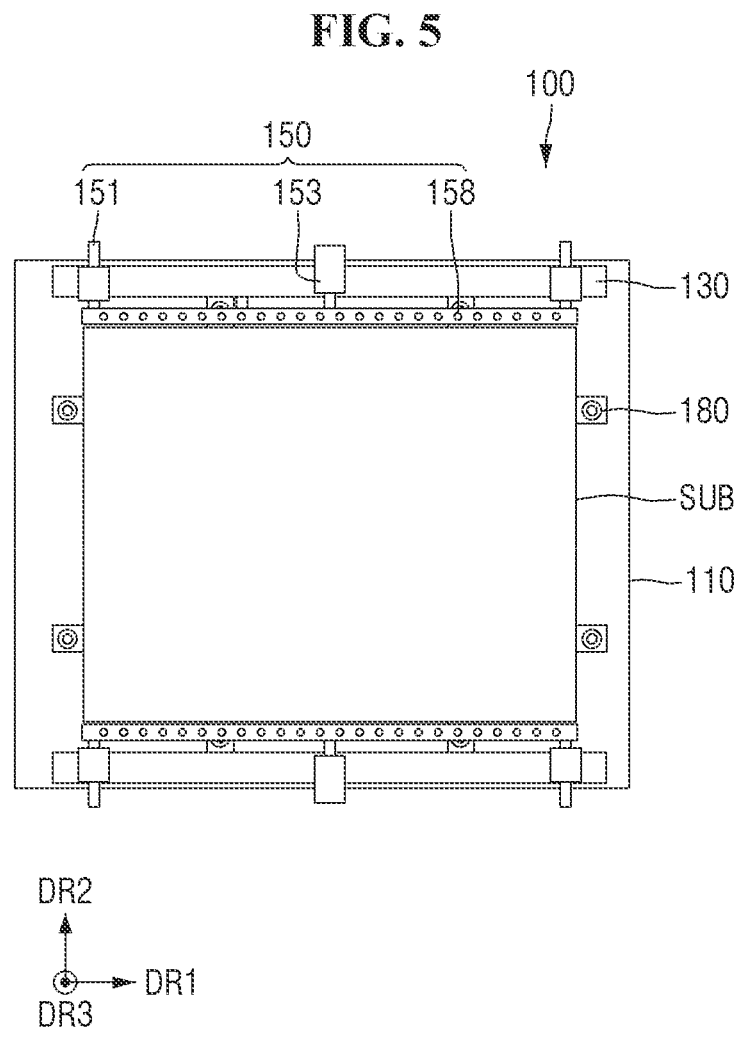

FIG. 5 is a plan view of an electric field forming unit according to an embodiment of the present disclosure.

Referring to FIGS. 1 and 5, the electric field forming unit 100 may include a stage 110, probe supports 130, probe units (e.g., probes) 150, and aligners 180.

The electric field forming unit 100 may form an electric field on the target substrate SUB when it is provided thereon while moving along the printing part PA, the transfer part TA, and the heat treatment part HA.

The stage 110 may provide space in which the target substrate SUB is to be disposed (or accommodated). The stage 110 may support the elements of (or included in) the electric field forming unit 100. For example, the probe supports 130, the probe units 150, and the aligners 180 may be disposed on the stage 110.

The planar shape of the stage 110 may generally conform to (or correspond to) the planar shape of the target substrate SUB. For example, when the stage 110 has a rectangular shape, the stage 110 may also have a rectangular shape. As another example, when the stage 110 has a circular shape, the stage 110 may also have a circular shape.

One or more aligners 180 for aligning the target substrate SUB may be disposed on the stage 110. A region surrounded by the aligners 180 may be a region in which the target substrate SUB is to be disposed. Two aligners 180 may be disposed along each side of the stage 110 and may be spaced apart from each other for a total of eight aligners 180 when the target substrate SUB has a rectangular shape. However, the present disclosure is not limited to this. The number and the arrangement of aligners 180 may vary depending on the shape or the type of the target substrate SUB.

The probe supports 130 and the probe units 150 may be disposed on the stage 110. The probe supports 130 may provide space in which the probe units 150 are to be disposed on the stage 110. For example, the probe supports 130 may be disposed on at least one side of the stage 110 to extend in the same direction as the at least one side of the stage 110. In some embodiments, the probe supports 130 may be disposed on both sides, in the second direction DR2, of the stage 110 (for example, on the upper and lower sides of the stage 110 in a plan view) and may extend in the first direction DR1, but the present disclosure is not limited thereto. The structure and the arrangement of the probe supports 130 may vary depending on the number, the arrangement, and the structure of the probe units 150 included in the electric field forming unit 100.

The probe units 150 may be disposed on the probe supports 130. The probe units 150 may form an electric field on (or around) the target substrate SUB provided on the stage 110. The probe units 150 may extend in one direction, for example, the first direction DR1, together with the probe supports 130 to a sufficient length to cover the entire target substrate SUB.

Each of the probe units 150 may include a probe driver 153, a probe jig 151, which is disposed in the probe driver 153 and receives an electrical signal, and a probe pad 158, which is connected to the probe jig 151 and transmits the electrical signal to the target substrate SUB.

The probe driver 153 may be disposed on the probe supports 130 to move the probe jig 151 and the probe pad 158. For example, the probe driver 153 may move the probe jig 151 in horizontal and vertical directions (e.g., in the second and third directions DR2 and DR3). The probe pad 158 may be connected to, or disconnected from, the target substrate SUB according to the driving of the probe driver 153.

The probe pad 158 may form an electric field on the target substrate SUB by using the electrical signal from the probe jig 151. The probe pad 158 may be connected to the target substrate SUB and may, thus, generate an electric field on the target substrate SUB by transmitting the electrical signal to the target substrate SUB. For example, the probe pad 158 may contact an electrode or a power pad of the target substrate SUB, and the electrical signal from the probe jig 151 may be transmitted to the electrode or the power pad of the target substrate SUB. The electrical signal transmitted to the target substrate SUB may form an electric field on the target substrate SUB. However, the present disclosure is not limited to this example. In another embodiment, the probe pad 158 may not contact the target substrate SUB, and the probe pad 158 may be a member that forms an electric field on the target substrate SUB by using the electrical signal from the probe jig 151.

Figure 6:
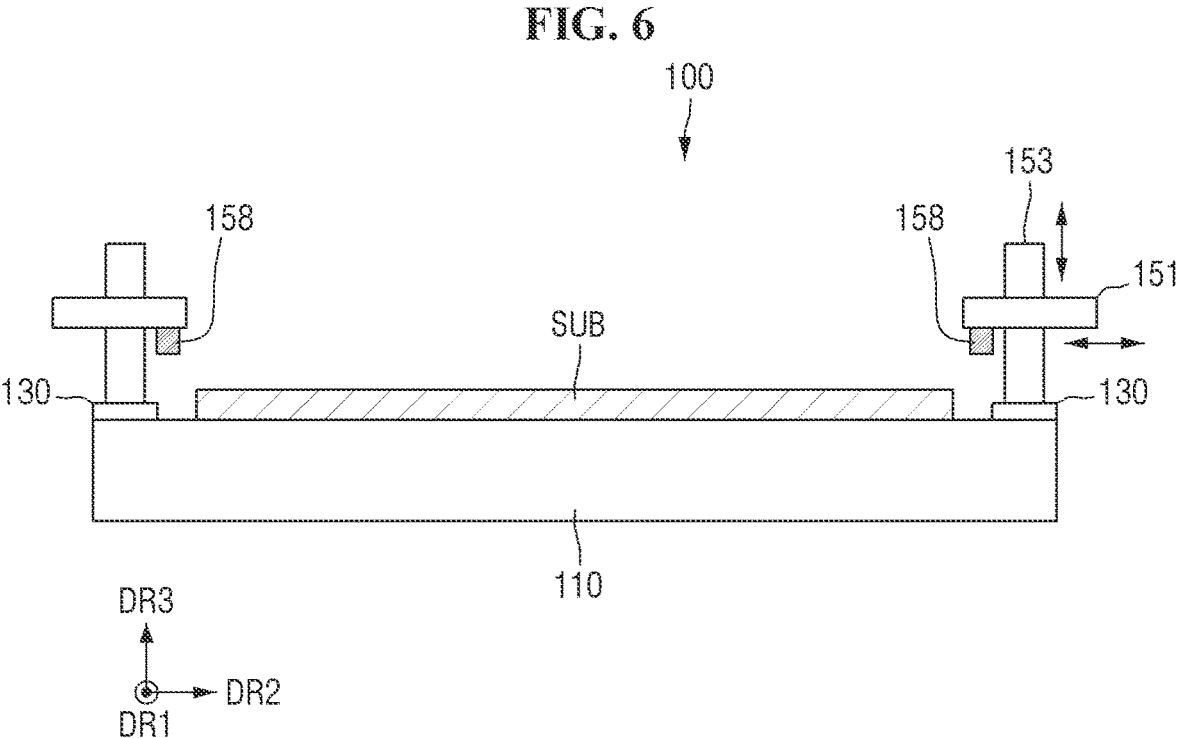
Figure 7:
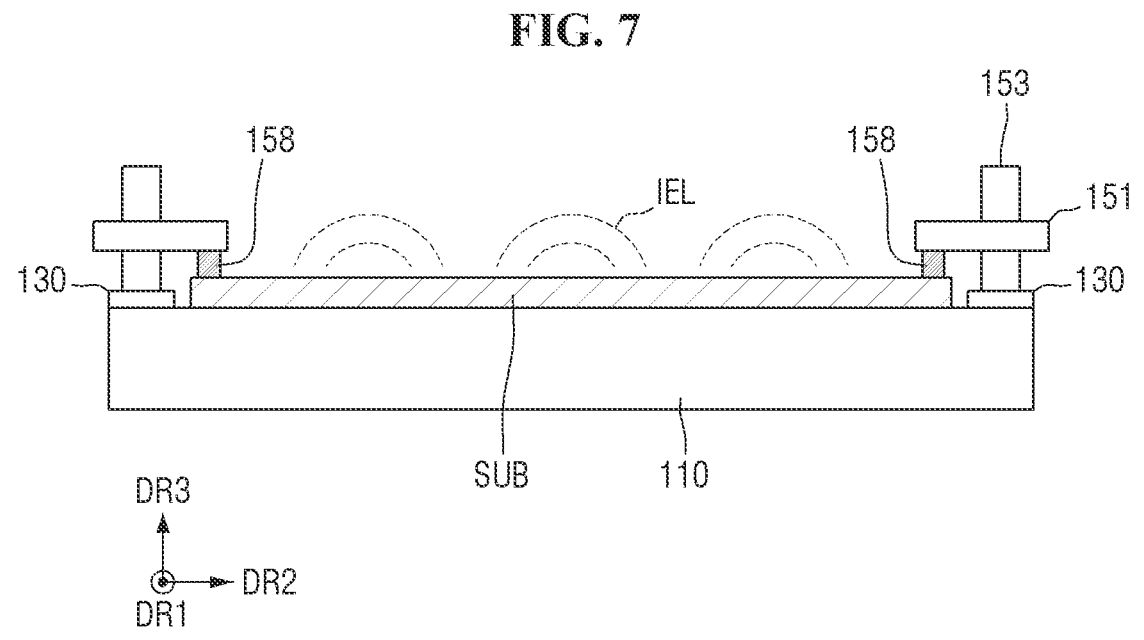

FIGS. 6 and 7 illustrate the operation of a probe unit according to an embodiment of the present disclosure.

The probe units 150 may operate according to the operation of the apparatus 1000. For example, the probe units 150 may operate to align the dipoles DP sprayed on the target substrate SUB during the aforementioned dipole alignment process. The forming of an electric field according to the operation of the probe units 150 will hereinafter be described with reference to FIGS. 6 and 7 according to.

FIG. 6 illustrates a first state in which an electric field is yet to be formed (e.g., is not yet formed) on the target substrate SUB. In the first state when an electric field is yet to be formed on the target substrate SUB provided on the stage 110, the probe units 150 may be disposed on the probe supports 130 to be spaced apart from the target substrate SUB. The probe drivers 153 of the probe units 150 may be driven in the third direction DR3, which is perpendicular to the second direction DR2, to space the probe pads 158 apart from the target substrate SUB. When the probe pads 158 are spaced apart from the target substrate SUB, an electric field may not be formed on the target substrate SUB.

FIG. 7 illustrates a second state in which an electric field is formed on the target substrate SUB. In the second state when an electric field IEL is formed on the target substrate SUB provided on the stage 110, the probe drivers 153 of the probe units 150 may be driven to electrically connect the probe pads 158 and the target substrate SUB. For example, the probe jigs 151 may be moved in the second direction DR2 so that the probe pads 158 are over the target substrate SUB. Then, the probe drivers 153 of the probe units 150 may be driven in the third direction DR3, which is perpendicular to the second direction DR2, to place the probe pads 158 in contact with the target substrate SUB. The probe jigs 151 of the probe units 150 may transmit an electrical signal to the probe pads 158, and the electric field IEL may be formed on the target substrate SUB via the probe pads 158.

FIGS. 6 and 7 illustrate that two probe units 150 are disposed on both (e.g., opposite) sides of the stage 110 and are connected to the target substrate SUB at the same time, but the present disclosure is not limited thereto. The probe units 150 may be driven separately. For example, the probe units 150 may be driven at the same time to form an electric field on the target substrate SUB or may be sequentially driven to sequentially form an electric field on the target substrate SUB.

During the dipole alignment process, the electric field forming unit 100 of the apparatus 1000 may drive the probe drivers 153 of the probe units 150 to form the electric field IEL on the target substrate SUB after the ink I is sprayed on the target substrate SUB. In steps other than the dipole alignment process, the electric field forming unit 100 of the apparatus 1000 may drive the probe drivers 153 of the probe units 150 again to separate the probe pads 158 from the target substrate SUB.

Figure 8:
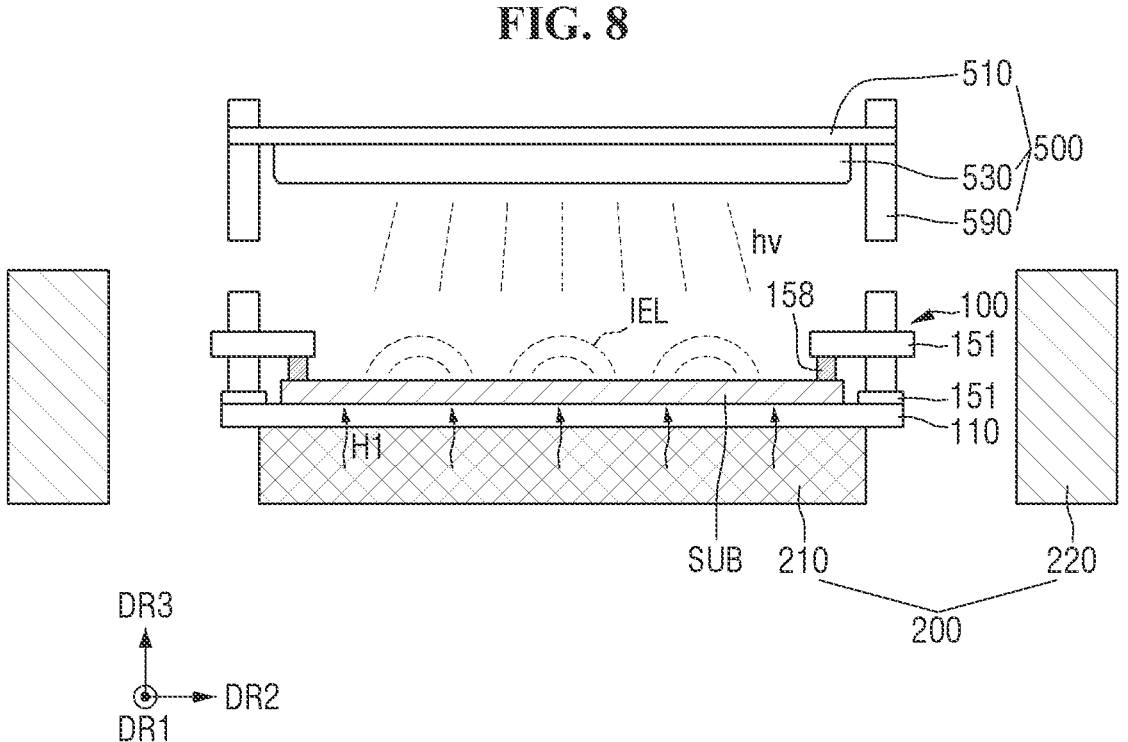
FIG. 8 is a cross-sectional view illustrating the operation of a light irradiation device and a temperature control device according to an embodiment of the present disclosure.
Figure 9:
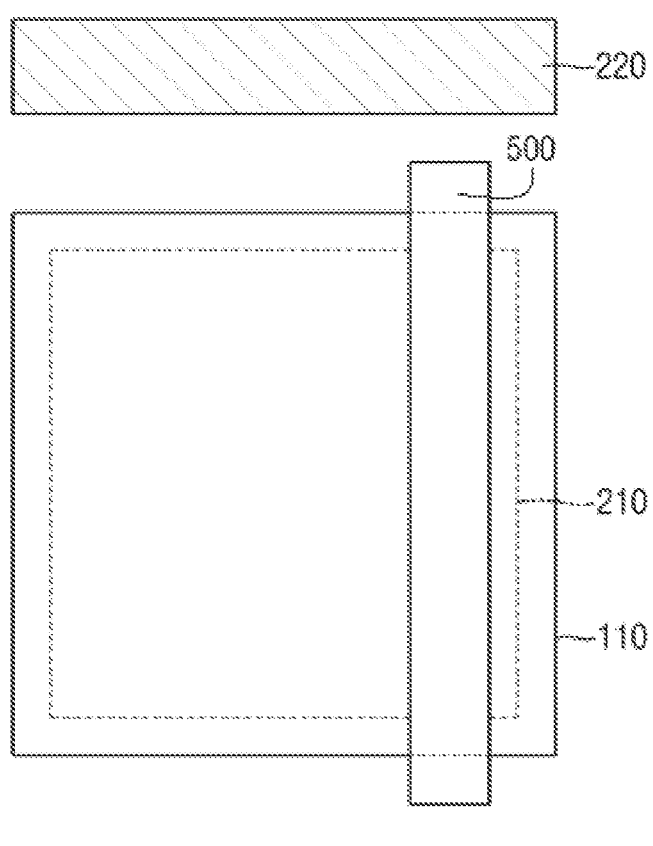
FIG. 9 is a plan view illustrating the arrangement of the light irradiation device and the temperature control device shown in FIG. 8 and a stage relative to one another.
Figure 9:

FIG. 8 is a cross-sectional view illustrating the operation of a light irradiation device and a temperature control device according to an embodiment of the present disclosure. FIG. 9 is a plan view illustrating the arrangement of the light irradiation device and the temperature control device shown in FIG. 8 and a stage relative to one another.

Referring to FIGS. 1, 8, and 9, the light irradiation device 500 and the temperature control device 200 may be disposed in the printing part PA. For example, the light irradiation device 500 and the temperature control device 200 may be disposed between the inkjet printing device 300 and the transfer unit 700 in the printing part PA.

The light irradiation device 500 and the temperature control device 200 may be disposed in a region where the dipole alignment process is to be performed, and the light irradiation device 500 may partially overlap the temperature control device 200 in the third direction DR3.

The light irradiation device 500 may include a second support 510 and a light irradiator 530. The light irradiation device 500 may further include a sensing unit (e.g., a sensor) 590.

The second support 510 may extend in the second direction DR2 to be disposed above the first and second rails RL1 and RL2. The second support 510 may be connected to a base frame that supports the second support 510 in the third direction DR3, and the electric field forming unit 100 may pass below the light irradiation device 500 in the first direction DR1.

The sensing unit 590 may be disposed in (or on) the second support 510 and may control the location of the light irradiator 530. The light irradiation device 500 may irradiate light hv to the electric field forming unit 100, and the sensing unit 590 may detect the location of the light irradiator 530 to irradiate the light hv to a designated location, but the present disclosure is not limited thereto. In some embodiments, the sensing unit 590 may be omitted.

The light irradiator 530 may be mounted on the second support 510. The light irradiator 530 may irradiate the light hv onto the electric field forming unit 100. The light irradiator 530 may be variously disposed in the second support 510 as would be understood by one skilled in the art.

The type of the light irradiator 530 is not particularly limited. In some embodiments, the light irradiator 530 may include mercury light, an iron (Fe)-based metal halide light, a gallium (Ga)-based metal halide light, or semiconductor light-emitting elements, but the present disclosure is not limited thereto.

The light irradiation device 500 may improve the alignment reactivity of the dipoles DP with respect to the electric field IEL by irradiating the light hv onto the ink I sprayed on the target substrate SUB, and this feature will be described in detail below.

The temperature control device 200 may include a temperature control unit (210 and 220). The temperature control unit (210 and 220) may include a heater 210 and a cooler 220. The temperature control unit (210 and 220) may control the temperature of the solvent SV included in the ink I sprayed on the target substrate SUB. The temperature control device 200 may indirectly control the temperature of the solvent SV by controlling the temperature of the target substrate SUB.

The heater 210 may be disposed below the stage 110 of the electric field forming unit 100. The heater 210 may be disposed below the stage 110 to apply first heat H1 to the target substrate SUB disposed on the stage 110 to heat the target substrate SUB. The first heat H1 generated by the heater 210 may be transmitted to the target substrate SUB and may, thus, raise the temperature of the target substrate SUB. As the temperature of the target substrate SUB increases, the temperature of the solvent SV sprayed on the target substrate SUB may also increase. The heater 210 may include a heating device for raising the temperature of the target substrate SUB. For example, the heater 210 may include a hot plate, an oven, a high-voltage direct-current (HVDC) or infrared (IR) irradiation device, or the like.

The cooler 220 may be disposed on a side of the stage 110 of the electric field forming unit 100. The cooler 220 may be disposed on a side of the stage 110 of the electric field forming unit 100 to cool the target substrate SUB disposed on the stage 110. The temperature of the target substrate SUB may be lowered by the cooler 220. As the temperature of the target substrate SUB decreases, the temperature of the solvent SV sprayed on the target substrate SUB may also decrease. The cooler 220 may include a cooling device for lowering the temperature of the target substrate SUB. For example, the cooler 220 may include, as a cooling device, an air- or water-cooling heat dissipation device.

The heater 210 is illustrated as being disposed below the electric field forming unit 100, and the cooler 220 is illustrated as being disposed on a side of the electric field forming unit 100. However, the arrangement of the heater 210 and the cooler 220 is not particularly limited. That is, the structures and the arrangement of the heater 210 and the cooler 220 is not particularly limited as long as the temperature of the target substrate SUB can be properly controlled while the dipole alignment process is being performed.

The temperature control device 200 may control the temperature of the solvent SV sprayed on the target substrate SUB by controlling the temperature of the target substrate SUB and, thus, may control the viscosity of the solvent SV by controlling the temperature of the solvent SV. By controlling the viscosity of the solvent SV, the flow of the dipoles DP aligned in the solvent SV can be facilitated, and as a result, the degree of alignment of the dipoles DP can be improved.

FIG. 8 illustrates an example in which the dipole alignment process is performed by using the electric field forming unit 100, the light irradiation device 500, and the temperature control device 200 after the printing device sprays the ink I onto the target substrate SUB. The dipole alignment process may be performed after the printing process. As the dipole alignment process is performed, the probe unit 150 of the electric field forming unit 100 may form the electric field IEL on the target substrate SUB. The apparatus 1000 may irradiate the light hv onto the target substrate SUB by using the light irradiator 530 of the light irradiation device 500 while forming the electric field IEL on the target substrate SUB by using the electric field forming unit 100. Also, the apparatus 1000 may control the temperature of the target substrate SUB by using the temperature control device 200 while forming the electric field IEL by using the electric field forming unit 100 and irradiating the light hv by using the light irradiation device 500. In the apparatus 1000, the dipole alignment process may be performed by using the electric field forming unit 100, the light irradiation device 500, and the temperature control device 200.

Figure 10:
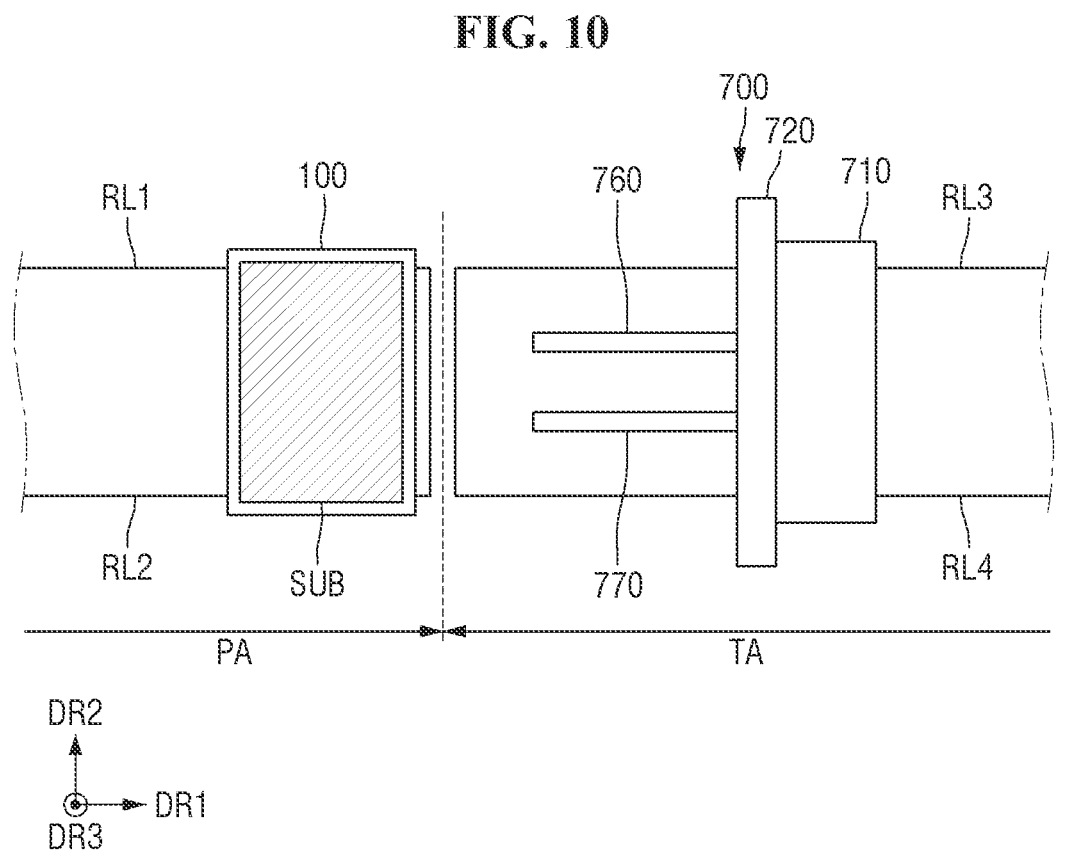

FIG. 10 is a partial plan view of the apparatus 1000 shown in FIG. 1.

Referring to FIGS. 1 and 10, the transfer unit 700 and third and fourth rails RL3 and RL4 may be disposed in the transfer part TA of the apparatus 1000.

The transfer unit 700 may be disposed in the transfer part TA, which is disposed between the printing part PA and the heat treatment part HA, and may move the electric field forming unit 100 from the printing part PA to the heat treatment part HA. After the printing process during which the ink I is sprayed onto the target substrate SUB, the transfer unit 700 may move the electric field forming unit 100 with the target substrate SUB disposed thereon to another region to perform another process. Also, the transfer unit 700 may also move the electric field forming unit 100 from the printing part PA to a region other than the heat treatment part HA and from the heat treatment part HA to another region.

The transfer unit 700 may be disposed on the third and fourth rails RL3 and RL4. The transfer unit 700 may move in the first direction DR1 along the third and fourth rails RL3 and RL4 via separate moving devices. As the transfer unit 700 moves, the electric field forming unit 100 may move in the first direction DR1 to be placed in the heat treatment part HA.

The transfer unit 700 may include a first mover 710, a transfer body 720, and first and second supports 760 and 770.

The first mover 710 may be disposed above the third and fourth rails RL3 and RL4. The first mover 710 of the transfer unit 700 may include a driver that can rotate in one direction. When the first mover 710 includes the driver, the first mover 710 can rotate so that the first and second supports 760 and 770 can rotate toward the region where the electric field forming unit 100 is disposed.

The transfer body 720 may be mounted on the first mover 710. The transfer body 720 may be variously mounted on the first mover 710 as would be understood by one skilled in the art. The transfer body 720 may provide space in which the first and second supports 760 and 770 are to be disposed (e.g., the transfer body 720 may accommodate the first and second supports 760 and 770).

The first and second supports 760 and 770 may be disposed on the transfer body 720. The first and second supports 760 and 770 may be disposed to be spaced apart from each other. The first and second supports 760 and 770 may extend in one direction. The first and second supports 760 and 770 may support the electric field forming unit 100 while the electric field forming unit 100 is being disposed in the transfer part TA. The electric field forming unit 100 may be disposed on the first and second supports 760 and 770 of the transfer unit 700 and may be moved from one region to another region within the transfer part TA.

Figure 11:
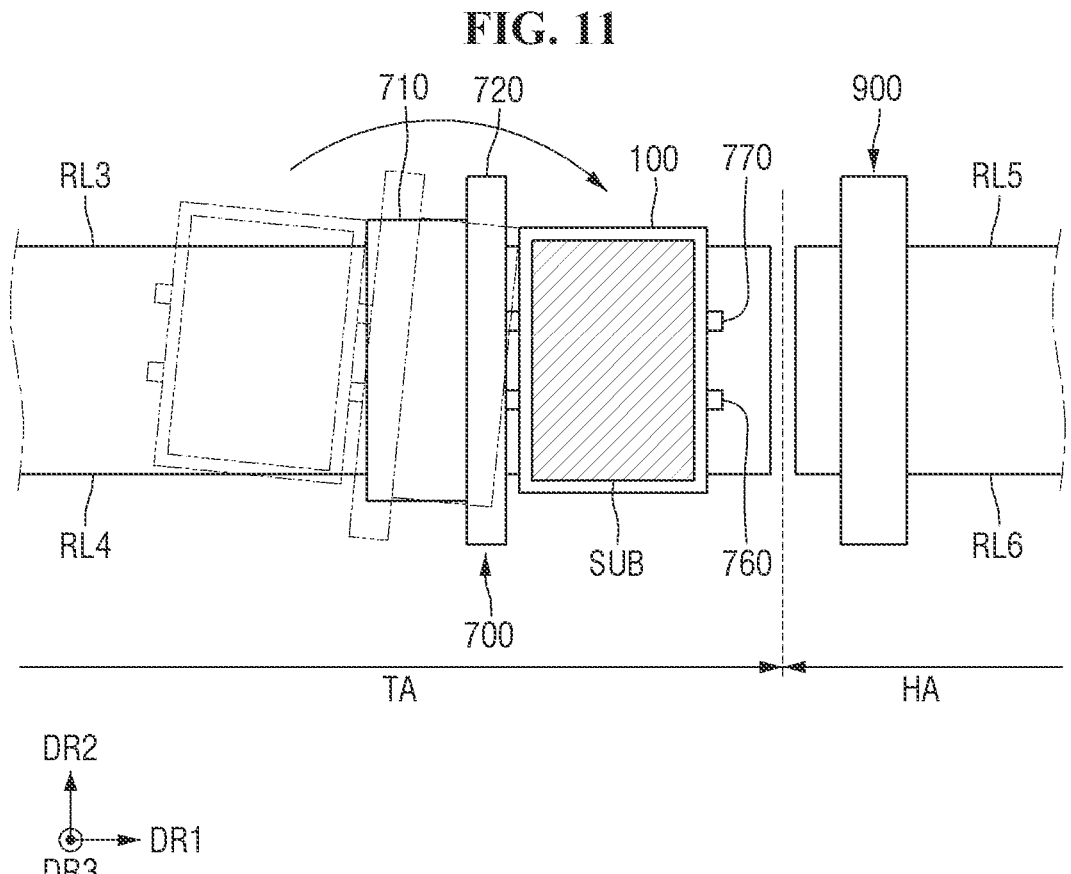
FIG. 11 illustrates the operation of a transfer unit according to an embodiment of the present disclosure.

FIG. 11 illustrates the operation of a transfer unit according to an embodiment of the present disclosure.

The operation of the transfer unit 700 will hereinafter be described with reference to FIGS. 1, 10, and 11.

Referring to FIG. 10, when the electric field forming unit 100 is disposed in the printing part PA, the first and second supports 760 and 770 of the transfer unit 700 may be disposed to face the printing part PA. Thereafter, the first mover 710 of the transfer unit 700 may move to place the electric field forming unit 100 on the first and second supports 760 and 770 (e.g., the first and second supports 760 and 770 may be moved to be under the electric field forming unit 100).

Thereafter, referring to FIG. 11, the first mover 710 of the transfer unit 700 may rotate so that the first and second supports 760 and 770 may face the heat treatment part HA. In other words, the first mover 710 of the transfer unit 700 may rotate so that the electric field forming unit 100 may face the heat treatment part HA.

The transfer unit 700 may move the electric field forming unit 100 and the target substrate SUB to another region by moving in the first and/or second directions DR1 and/or DR2 and rotating in one direction according to a series of processes of the apparatus 1000.

Figure 12:
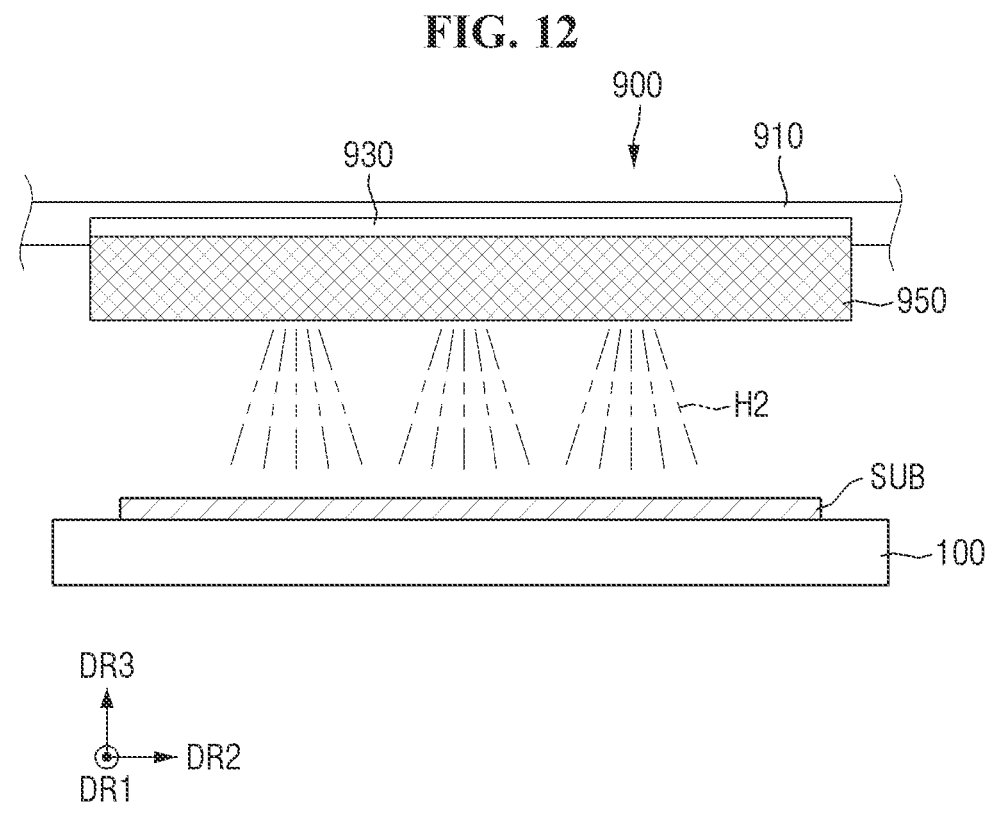

FIG. 12 is a cross-sectional view illustrating the operation of a heat treatment unit according to an embodiment of the present disclosure.

Referring to FIGS. 1, 11, and 12, the heat treatment device 900 and fifth and sixth rails RL5 and RL6 may be disposed in the heat treatment part HA of the apparatus 1000.

The fifth and sixth rails RL5 and RL6 may be disposed in the heat treatment part HA and may extend in the first direction DR1. The electric field forming unit 100, moved from the printing part PA to the heat treatment part HA by the transfer unit 700, may be disposed on the fifth and sixth rails RL5 and RL6. The electric field forming unit 100 may move in the first direction DR1 along the fifth and sixth rails RL5 and RL6 via separate moving devices. As the electric field forming unit 100 passes the heat treatment device 900 by, for example, moving in the first direction DR1, the ink I sprayed on the electric field forming unit 100 may be dried.

The heat treatment device 900 may include a third support 910, a heat treatment body 930, and a heat treatment unit 950.

The third support 910 may extend in the second direction DR2 and may be disposed above the fifth and sixth rails RL5 and RL6. The third support 910 may be connected to a base frame that supports the third support 910 in the third direction DR3, and the electric field forming unit 100 may pass below the heat treatment device 900 (e.g., may pass below the third support 910 of the heat treatment device 900) in the first direction DR1.

The heat treatment body 930 may be mounted on the third support 910. The heat treatment body 930 may provide space in which the heat treatment unit 950 is to be disposed (or accommodated). The heat treatment unit 950 may generate heat on the target substrate SUB to remove (e.g., evaporate) the solvent SV of the ink I sprayed on the target substrate SUB. The heat treatment unit 950 may include a heat generating device. The heat generating device is not particularly limited, and examples thereof are known to those skilled in the art. For example, the heat treatment unit 950 may generate heat by applying second heat H2 on the target substrate SUB. In one embodiment, the second heat H2 may include infrared light, and the second heat treatment unit 950 may include an IR irradiation device.

The heat treatment unit 950 may be disposed on a bottom surface of the heat treatment body 930, which is mounted on the third support 910. The heat treatment unit 950 may be spaced apart from the target substrate SUB in the third direction DR3. The heat treatment unit 950 may be spaced apart from the electric field forming unit 100 in the third direction DR3 so that other elements disposed on the target substrate SUB may not be damaged by the second heat H2 applied by the heat treatment unit 950.

The operation of the apparatus 1000 will hereinafter be described with reference to FIGS. 1 through 12 and other drawings.

Figure 13:
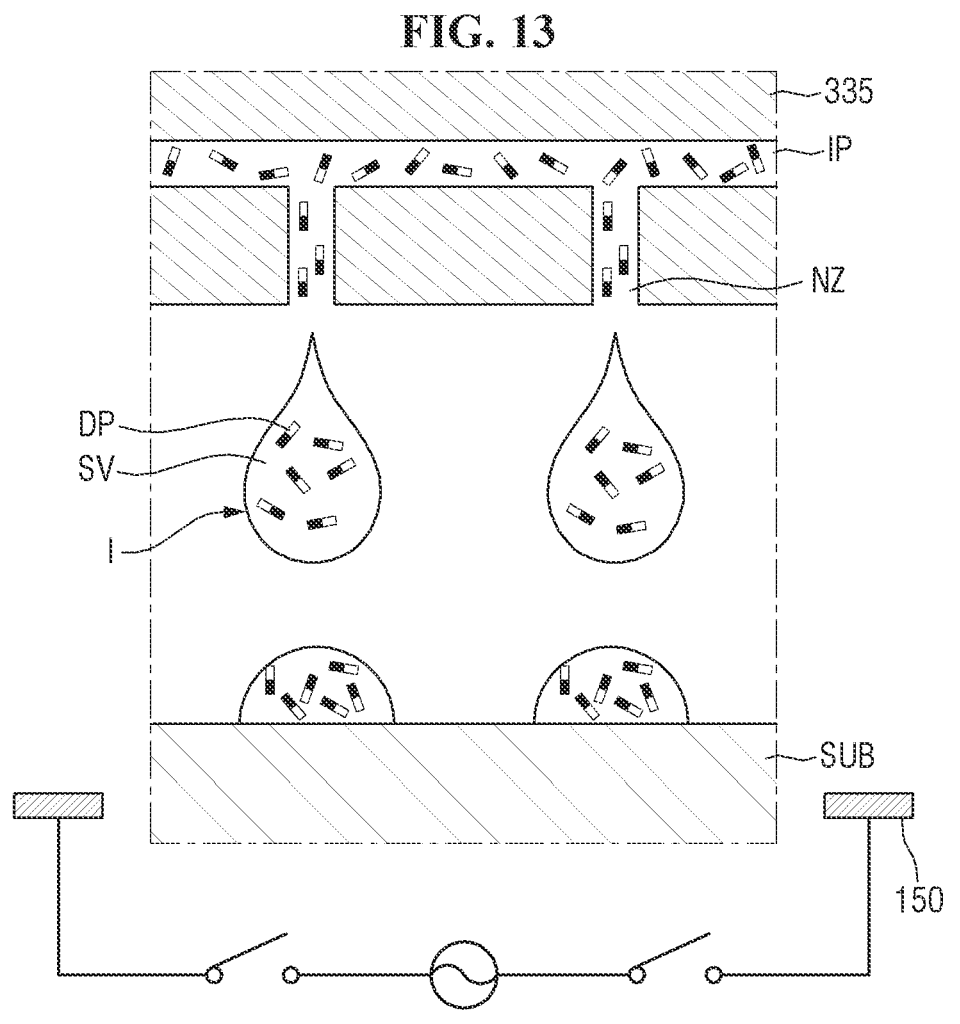

FIG. 13 illustrates ink being ejected from an inkjet head according to the embodiment shown in FIG. 3.

Referring to FIGS. 1, 4, and 13, the target substrate SUB is arranged on the electric field forming unit 100, and the ink I is sprayed onto the target substrate SUB by using the inkjet printing device 300. As mentioned above, the ink I may be sprayed through nozzles NZ of an inkjet head 335.

The ink I may include a plurality of dipoles DP and a solvent SV having the dipoles DP dispersed therein. The dipoles DP may be ejected through the nozzles NZ together with the solvent SV. The dipoles DP may be supplied to the inkjet head 335 in a state of being dispersed in the solvent SV.

The dipoles DP may have first and second polarities, which are different from each other, and may have a dipole moment. The dipoles DP having a dipole moment may have a random orientation in the absence of an external force. As illustrated in FIG. 13, when the probe unit 150 and the target substrate SUB are spaced apart from each other and are not electrically connected, the dipoles DP are not aligned in any particular direction when the ink I is sprayed onto the target substrate SUB through the nozzles NZ.

For example, during the printing process, the target substrate SUB disposed on the electric field forming unit 100 may not be electrically connected to the probe unit 150. Thus, the dipoles DP may not be aligned in any particular direction when the ink I is sprayed onto the target substrate SUB through the nozzles NZ, but the dipoles DP may settle on the target substrate SUB.

Figure 14:
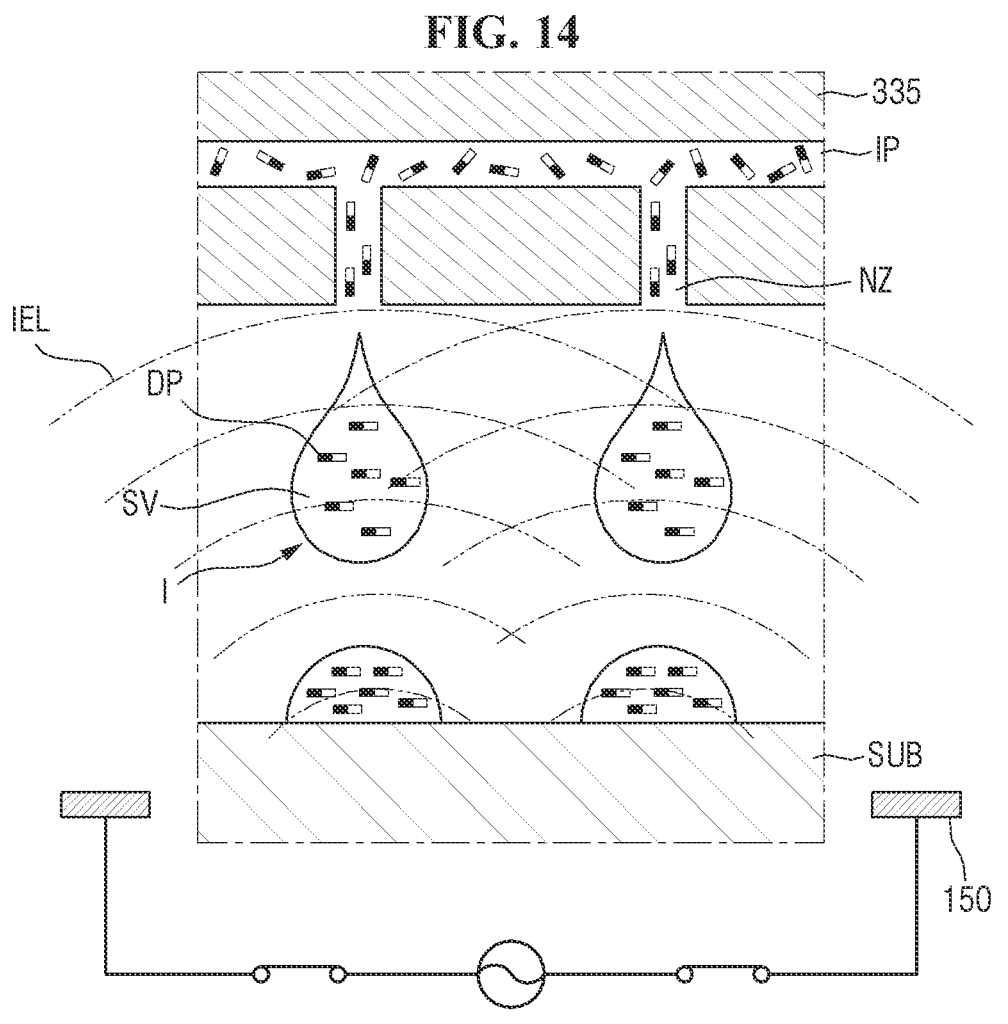

FIG. 14 is a partial cross-sectional view illustrating ink being ejected from an inkjet head according to another embodiment of the present disclosure.

Referring to FIG. 14, during a printing process, the target substrate SUB disposed on the electric field forming unit 100 may be electrically connected to the probe unit 150. Accordingly, the ink I may be sprayed onto the target substrate SUB when the electric field IEL formed on the target substrate SUB.

When the electric field IEL is formed on the target substrate SUB, the ink I may be affected by the electric field IEL when it is sprayed onto the target substrate SUB through the nozzles NZ. Once the dipoles DP in the ink I are in (e.g., are acted on by) the electric field IEL, the dipoles DP may receive an electric force and may, thus, be aligned in the direction of the electric field IEL. When the ink I is sprayed while the electric field IEL is formed (or is active), the dipoles DP in the electric field IEL may be aligned in a horizontal direction as they are sprayed onto the target substrate SUB.

Figure 15:
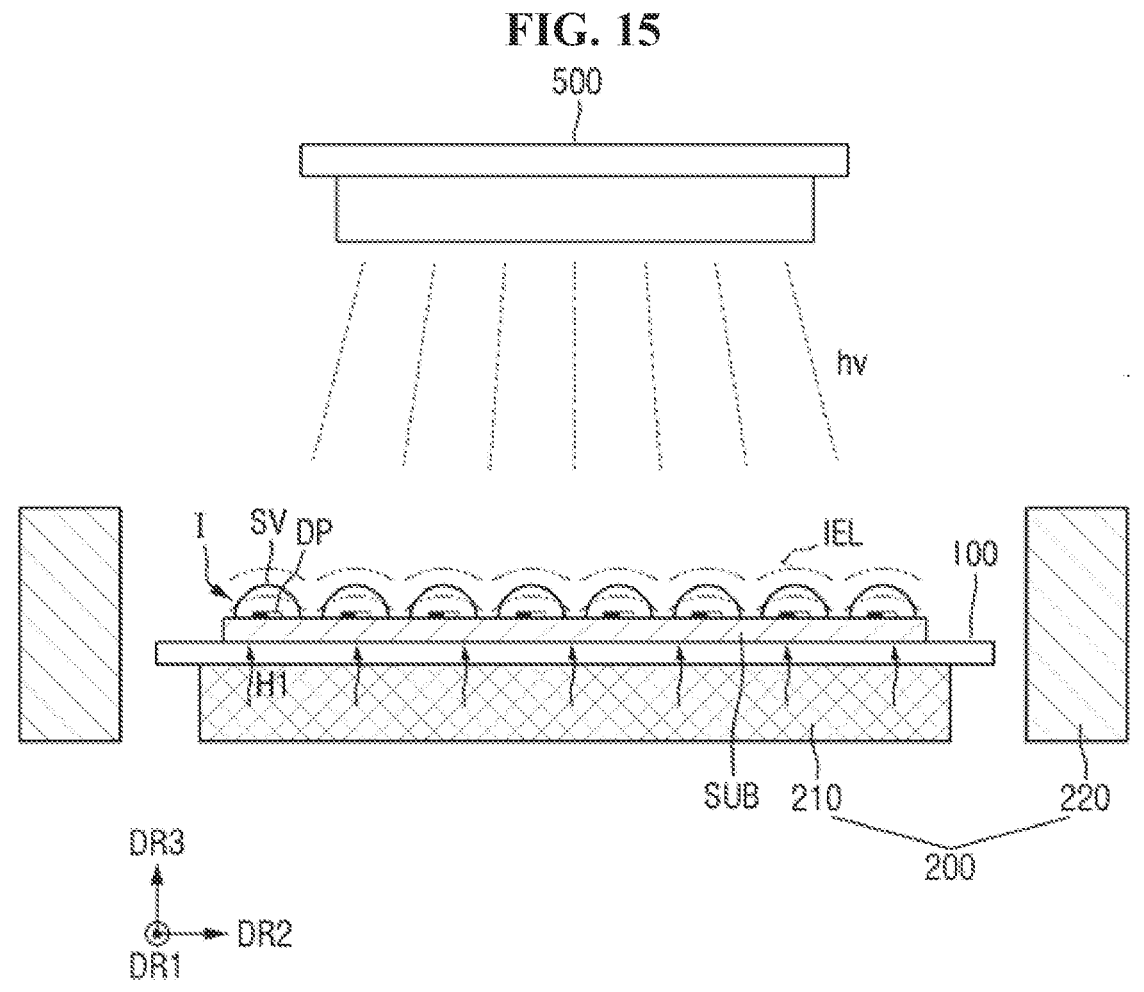

FIG. 15 is a cross-sectional view illustrating a dipole alignment process according to an embodiment of the present disclosure.

After the printing process performed in the printing part PA by using the inkjet printing device 300, the electric field forming unit 100 may move to the region where the light irradiation device 500 and the temperature control device 200 are disposed. Once the electric field forming unit 100 moves to the region where the light irradiation device 500 and the temperature control device 200 are disposed, the dipoles DP disposed on the target substrate SUB may be aligned.

The light irradiation device 500 and the temperature control device 200 of the apparatus 1000 may be disposed in the printing part PA.

Referring to FIG. 15, after the printing process, the electric field forming unit 100 may be arranged on the heater 210 of the temperature control device 200. The electric field forming unit 100 is illustrated as being disposed directly on the heater 210, but the present disclosure is not limited thereto. The arrangement of the heater 210 is not particularly limited as long as the heater 210 can properly transmit the first heat H1 to the target substrate SUB to raise the temperature of the target substrate SUB.

When the electric field forming unit 100 is arranged on the heater 210, the alignment of the dipoles DP may be performed. The dipole alignment process may be performed by forming the electric field IEL on the target substrate SUB by using the electric field forming unit 100, irradiating the light hv to the target substrate SUB by using the light irradiation device 500, and controlling the temperature of the target substrate SUB by using the temperature control device 200.

The dipoles DP having a dipole moment may receive an electric force (e.g., a predetermined electric force) from the electric field IEL formed by the electric field forming unit 100 and may, thus, be aligned in one direction.

When the light irradiation device 500 applies the light hv to the dipoles DP, partial polarities are further formed in the dipoles DP so that the dipole moment of the dipoles DP may increase and the electric force from the electric field IEL may increase. Accordingly, the alignment reactivity of the dipoles DP dispersed in the solvent SV on the target substrate SUB may increase, and the dipoles DP may be aligned on the target substrate SUB with a high degree of alignment.

When the temperature control device 200 controls the temperature of the target substrate SUB, the temperature of the solvent SV of the ink I sprayed on the target substrate SUB may be controlled by the target substrate SUB (e.g., the temperature of the solvent SV of the ink I may be indirectly controlled by the temperature control device 200).

When the heater 210 transmits (or emits) the first heat H1 to the target substrate SUB, the temperature of the target substrate SUB increases, which causes the temperature of the solvent SV sprayed on the target substrate SUB to increase. The viscosity of the solvent SV may vary depending on the temperature of the solvent SV. For example, as the temperature of the solvent SV increases, the viscosity of the solvent SV may decrease. Thus, when the target substrate SUB is heated by the heater 210, the temperature of the solvent SV may increase and the viscosity of the solvent SV may decrease. When the viscosity of the solvent SV decreases, the flow of the dipoles DP that rotate or move within the solvent SV by receiving (or being acted upon by) an electric force (e.g., a predetermined electric force) from the electric field IEL can be facilitated. For example, as the viscosity of the dipoles SV decreases, the flow of the dipoles DP in the solvent SV can be facilitated (e.g., improved), and as a result, the degree of alignment of the dipoles DP can be improved.

If the temperature of the target substrate SUB increases such that the temperature of the solvent SV becomes higher than a reference temperature at which the solvent SV dries (or evaporates), the solvent SV may be dried during the alignment of the dipoles DP. If the solvent SV is dried, the alignment of the dipoles DP may not be properly performed. Thus, the cooler 220 may cool the target substrate SUB so that the temperature of the target substrate SUB does not exceed the reference temperature.

Figure 16:
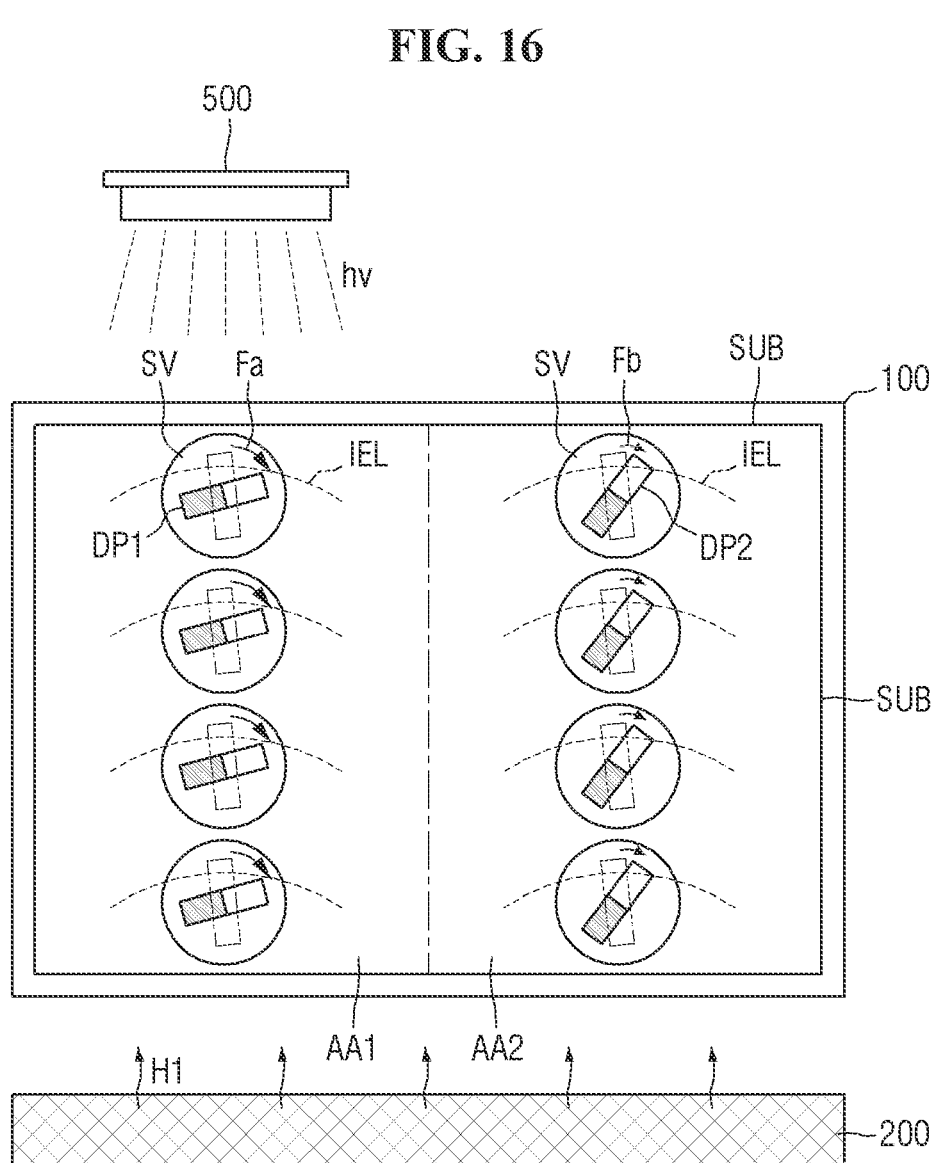
FIGS. 16 and 17 illustrate dipoles being aligned according to the operation of the apparatus shown in FIG. 1.
Figure 17:
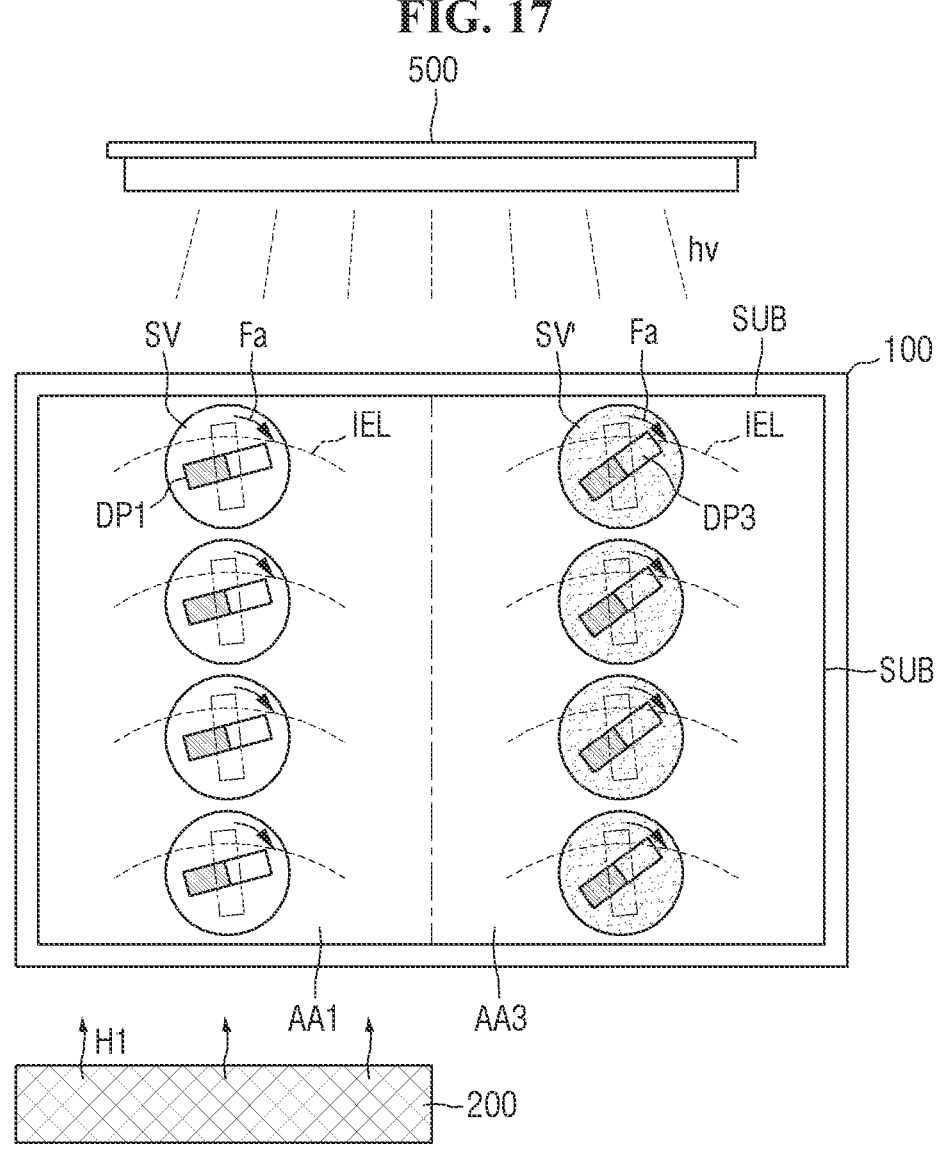

FIGS. 16 and 17 illustrate dipoles being aligned according to the operation of the apparatus 1000 shown in FIG. 1.

Referring to FIGS. 16 and 17, the ink I, which includes the dipoles DP and the solvent SV having the dipoles DP dispersed therein, may be sprayed onto the target substrate SUB on (e.g., prepared on) the electric field forming unit 100. The electric field IEL may be formed on the target substrate SUB by using the electric field forming unit 100.

A first area AA1 of FIGS. 16 and 17 may be a region at where the temperature of the target substrate SUB is to be raised by using the temperature control device 200 and the light hv is to be irradiated to the target substrate SUB by using the light irradiation device 500. A second area AA2 of FIG. 16 may be a region at where the temperature of the target substrate SUB is to be raised with the use of the temperature control device 200 but at where the light hv is not to be irradiated to the target substrate SUB. A third area AA3 of FIG. 17 may be a region where the light hv is to be irradiated to the target substrate SUB by using the light irradiation device 500 but at where the temperature of the target substrate SUB is not to be controlled.

Referring first to FIG. 16, the temperature of a first solvent SV sprayed onto the first area AA1 may be the same as the temperature of a first solvent SV sprayed onto the second area AA2. Thus, the viscosity of the first solvent SV sprayed onto the first area AA1 may be the same as the viscosity of the first solvent SV sprayed onto the second area AA2. Dipoles DP dispersed in the first solvent SV may be aligned according to the magnitude of a force applied to the dipoles DP.

The dipole moment of first dipoles DP1 disposed in the first area AA1, to which the light hv is irradiated by the light irradiation device 500, may differ from the dipole moment of second dipoles DP1 disposed in the second area AA2, to which the light hv is not irradiated by the light irradiation device 500. The dipole moment of the first dipoles DP1 may be greater than the dipole moment of the second dipoles DP2. Electrons present in the dipoles DP having a polarity may react to the light hv irradiated by the light irradiation device 500, and the dipole moment between the first and second polarities of the dipoles DP may increase. When the dipoles DP have a relatively large dipole moment, the dipoles DP may receive a stronger electric force from the same electric field IEL, and as a result, the dipoles DP can be more uniformly aligned on the target substrate SUB.

The first dipoles DP1, to which the light hv is irradiated, may receive a first force Fa and may, thus, be aligned in one direction, and the second dipoles DP2 may receive a second force Fb and may, thus, be aligned in one direction. Because the dipole moment of the first dipoles DP1 is greater than the dipole moment of the second dipoles DP2, the first force Fa may be stronger than the second force Fb. The dipoles DP may rotate or move in one direction by receiving the first or second force Fa or Fb from their respective original locations as indicated by dotted lines. Because the second dipoles DP2 aligned by the second force Fb receive a weaker force than the first force Fa, the second dipoles DP2 rotate or move a smaller amount than the first dipoles DP1. As a result, the second dipoles DP2 may be non-uniformly aligned or may not be aligned as desired or intended. However, because the first dipoles aligned by the first force Fa receive a stronger force than the second force Fb, the first dipoles DP1 rotate or move by a greater amount than the second dipoles DP2. Thus, the first dipoles DP1 can be relatively uniformly aligned.

Referring to FIG. 17, because the light hv is irradiated to the first and third areas AA1 and AA3 by the light irradiation device 500, the dipole moment of the first dipoles DP1 sprayed onto the first area AA1 may be the same as the dipole moment of third dipoles DP3 sprayed onto the third area AA3. The first dipoles DP1 and the third dipoles DP3 having the same dipole moment may be aligned in one direction by receiving the same first force Fa.

The temperature of the first solvent SV disposed in the first area AA1, in which the temperature of the target substrate SUB is raised by using the temperature control device 200, may differ from the temperature of a second solvent SV' disposed in the third area AA3, in which the temperature of the target substrate SUB is not raised due to, for example, the absence of the temperature control device 200. For example, the temperature of the first solvent SV may be higher than the temperature of the second solvent SV'. Thus, the viscosity of the first solvent SV may be lower than the viscosity of the second solvent SV'.

The first dipoles DP1 and the third dipoles DP3, receiving the same force, may be aligned to different degrees depending on the viscosity of the first solvent SV in which the first dipoles DP1 are dispersed and the viscosity of the second solvent SV' in which the third dipoles DP3 are dispersed. The viscosity of the second solvent SV' having a lower temperature may be higher than the viscosity of the first solvent SV having a higher temperature. Thus, the third dipoles DP3 receiving the first force Fa in the second solvent SV' may rotate or move by a smaller degree than the first dipoles DP1 receiving the first force Fa in the first solvent SV.

Because the apparatus 1000 includes the light irradiation device 500, which applies the light hv to the dipoles DP, and the temperature control device 200, which controls the temperature of the solvent SV by controlling the temperature of the target substrate SUB, the degree of alignment of the dipoles DP in the apparatus 1000 is improved. Accordingly, the magnitude of light hv to achieve a desired degree of alignment of the dipoles DP can be reduced, or the duration of the application of the light hv can be shortened. Therefore, the duration of the dipole alignment process can be shortened, and the efficiency of the dipole alignment process can be improved due to reduced light radiation energy.

A central wavelength range of the light hv irradiated by the light irradiation device 500 is not particularly limited. The central wavelength range of the light hv may vary depending on the type of the dipoles DP. For example, in an embodiment in which light emitted from active layers 33 of light-emitting elements 30 has a first wavelength range, the central wavelength range of the light hv irradiated by the light irradiation device 500 may also be the first wavelength range.

Figure 18:
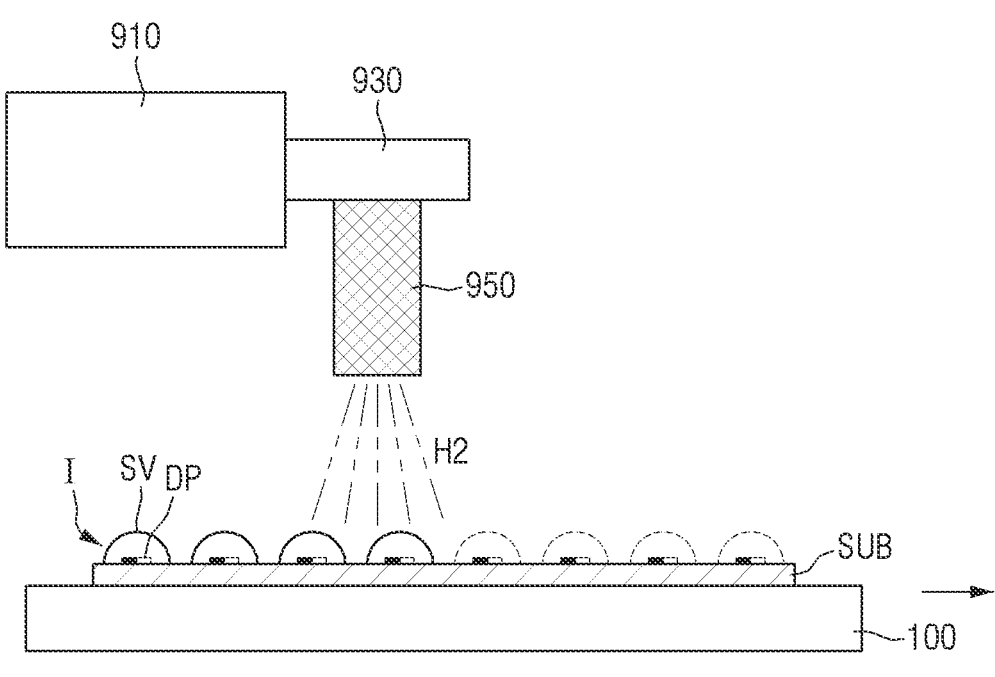
FIG. 18 illustrates the operation of a heat treatment device according to an embodiment of the present disclosure.
Figure 18:
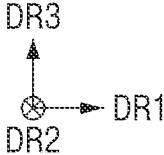

FIG. 18 illustrates the operation of a heat treatment device according to an embodiment of the present disclosure.

Referring to FIG. 18, the heat treatment device 900 may apply the second heat H2 to an area of the target substrate SUB that overlaps the heat treatment unit 950 (e.g., is below the heat treatment device 900). As illustrated in FIG. 18, the second heat H2 may be applied only to the overlapping area of the target substrate SUB and the heat treatment unit 950. When the electric field forming unit 100 moves in the first direction DR1 to pass below the heat treatment device 900, the solvent SV of the ink I sprayed on the target substrate SUB may be sequentially removed as the electric field forming unit 100 moves. When the second heat H2 is applied onto the target substrate SUB and is transmitted to the solvent SV, the solvent SV may be removed (e.g., evaporated) from the target substrate SUB, as indicated by dotted lines, so that, from among the components of the ink I, only the dipoles DP exist (or remain) on the target substrate SUB.

The apparatus 1000 includes the electric field forming unit 100, the inkjet printing device 300, the light irradiation device 500, the temperature control device 200, the transfer unit 700, and the heat treatment device 900 and can align the dipoles DP on the target substrate SUB in one direction. The apparatus 1000 can increase the dipole moment of the dipoles DP by using the light irradiation device 500 and can reduce the viscosity of the solvent SV by using the temperature control device 200. As a result, the alignment reactivity and the degree of alignment of the dipoles DP can be improved due to the presence of the electric field IEL formed by the electric field forming unit 100.

During the dipole alignment process as part of the fabrication process of a display device using the apparatus 1000, the viscosity of the solvent SV disposed on the target substrate SUB can be reduced by raising the temperature of the solvent SV by using the temperature control device 200, and the degree of alignment of the dipoles DP disposed on the target substrate SUB can be improved by irradiating light by using the light irradiation device 500. The process of aligning the dipoles DP by using the apparatus 1000 will hereinafter be described.

Figure 19:
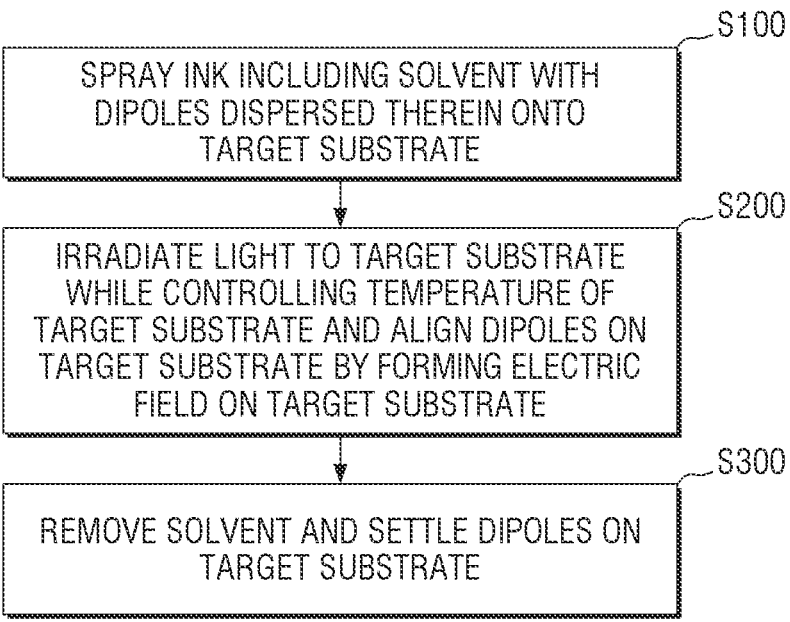
FIG. 19 is a flowchart describing some aspects of a method of aligning dipoles according to an embodiment of the present disclosure.

FIG. 19 is a flowchart describing a method of aligning dipoles according to an embodiment of the present disclosure. FIGS. 20 through 23 illustrate the process of aligning dipoles by using the apparatus 1000 shown in FIG. 1.

The method of FIG. 19 may include: spraying ink including a solvent with dipoles dispersed therein onto a target substrate (S100); irradiating light to the target substrate while controlling the temperature of the target substrate, and aligning the dipoles on the target substrate by forming an electric field on the target substrate (S200); and removing the solvent and settling the dipoles on the target substrate (S300).

Referring to FIGS. 20 through 23, fourth and fifth directions DR4 and DR5 may be directions that fall on the same plane and are orthogonal to each other, and a sixth direction DR6 may be a direction that is perpendicular to the fourth and fifth directions DR4 and DR5. For example, one side of a layer in the sixth direction DR6 may be referred to as an upper side of the layer, and the other (or opposite) side of the layer in the sixth direction DR6 may be referred to as a lower side of the layer.

Figure 20:
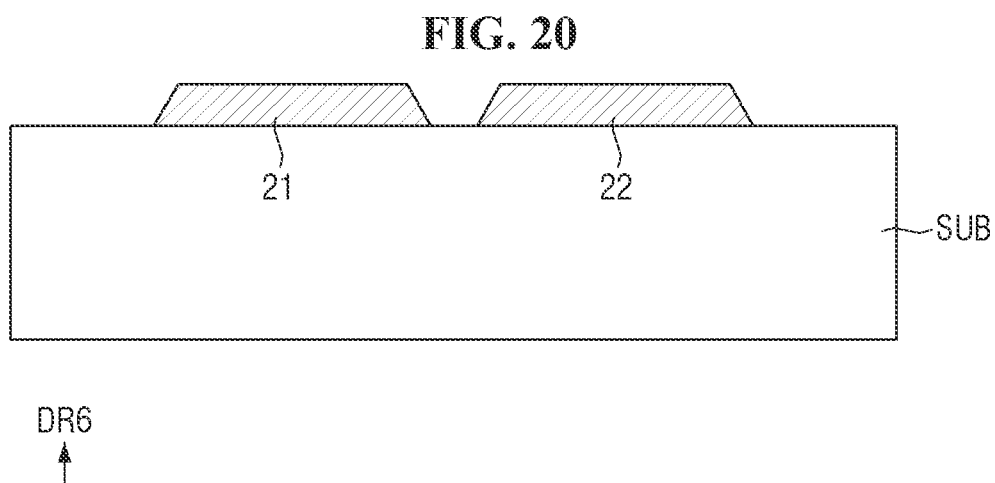

Referring first to FIG. 20, the target substrate SUB is prepared. For example, first and second electrodes 21 and 22 may be formed on the target substrate SUB.

Thereafter, in S100 of FIG. 19, the ink I, which includes the solvent SV having the dipoles DP dispersed therein, is sprayed onto the target substrate SUB.

Figure 21:
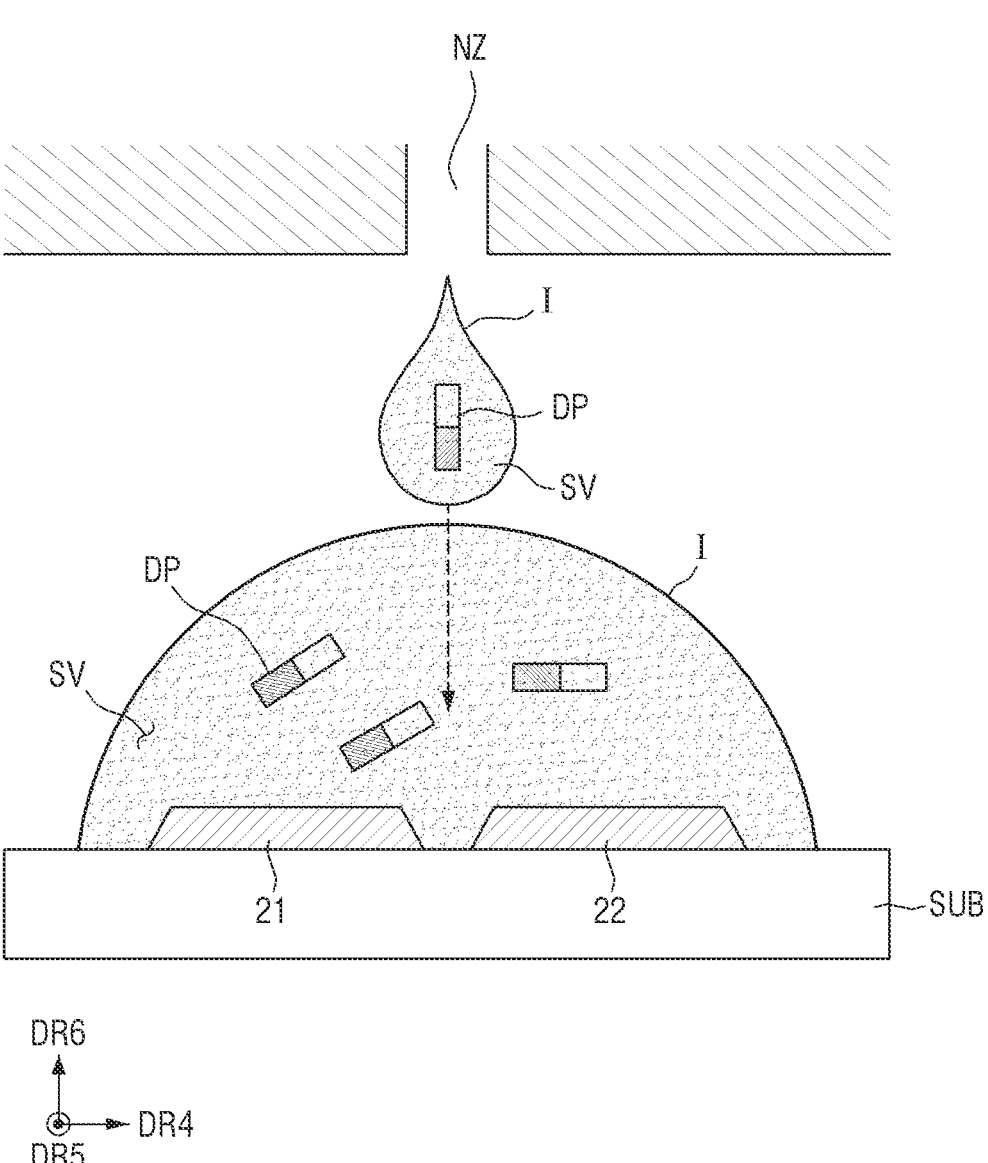

Specifically, referring to FIG. 21, the ink I may be ejected from an inkjet head 335 of the inkjet printing device 300 and may be sprayed onto the first and second electrodes 21 and 22 of the target substrate SUB. The solvent SV disposed on the target substrate SUB by being ejected from the inkjet head 335 may have a first temperature. The solvent SV having the first temperature may have a first viscosity.

Thereafter, in S200 of FIG. 19, the light hv is irradiated to the target substrate SUB while controlling the temperature of the target substrate SUB, and the dipoles DP are aligned on the target substrate SUB by forming the electric field IEL on the target substrate SUB.

Figure 22:
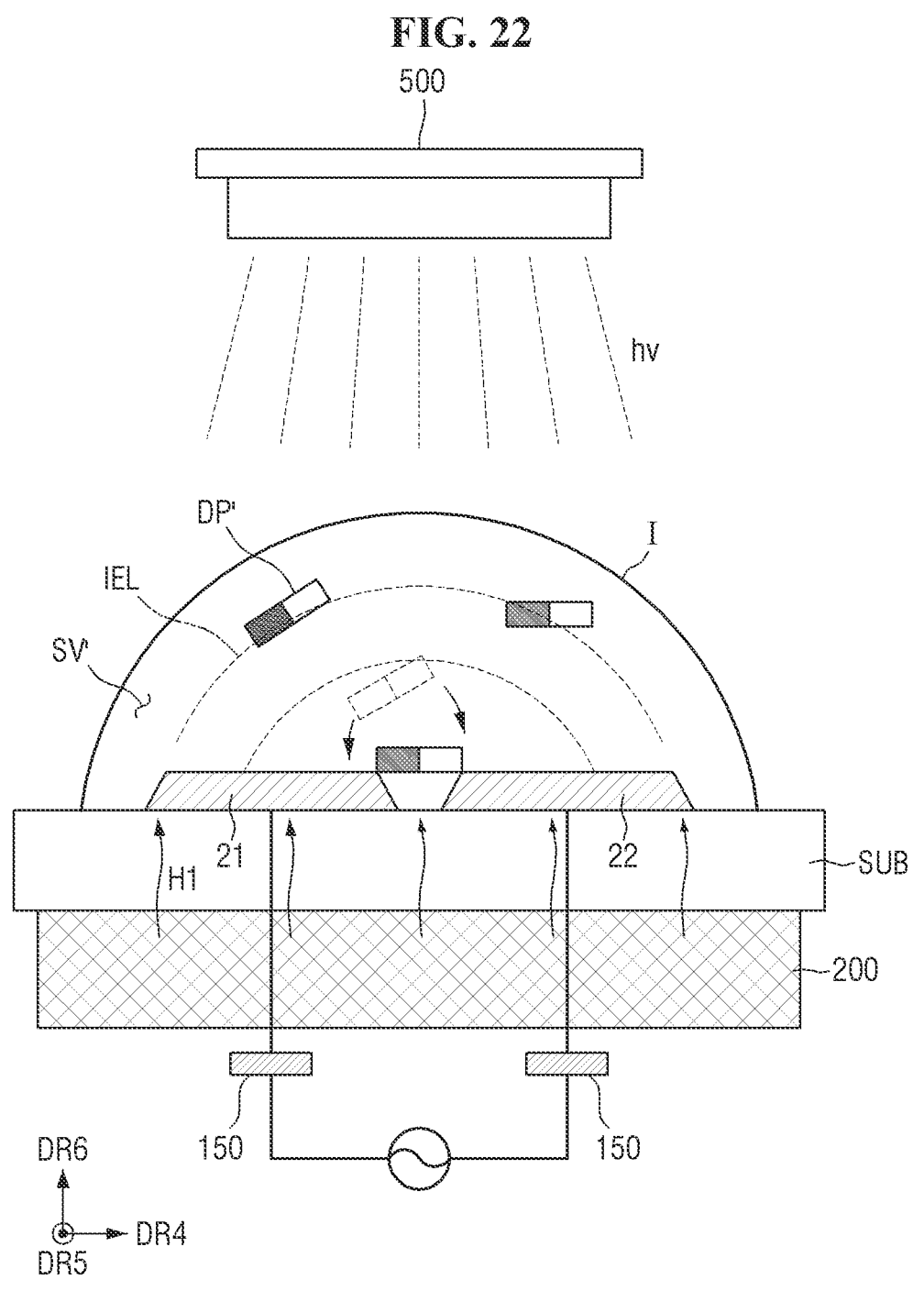

Specifically, referring to FIG. 22, the electric field IEL may be formed on the target substrate SUB, and the dipoles DP may be aligned by using the electric field IEL. The dipoles DP may be arranged between the first and second electrodes 21 and 22 by dielectrophoresis.

As mentioned above, the electric field IEL may be formed on the target substrate SUB by using the probe unit 150. The probe unit 150 may apply electrical signals to the first and second electrodes 21 and 22. The probe unit 150 may be connected to a pad (e.g., a predetermined pad) provided on the target substrate SUB and may apply electrical signals to the first and second electrodes 21 and 22, which are connected to the pad. When the probe unit 150 applies electrical signals to the first and second electrodes 21 and 22, the electric field IEL may be formed between the first and second electrodes 21 and 22. A dielectrophoretic force from the electric field IEL may act upon dipoles DP'. Due to the dielectrophoretic force, the dipoles DP' may be arranged between the first and second electrodes 21 and 22 while changing their alignment direction and location.

During the alignment of the dipoles DP' through the formation of the electric field IEL via the probe unit 150, the light hv may be irradiated to the ink I sprayed on the target substrate SUB by using the light irradiation device 500.

When the light irradiation device 500 applies the light hv to the ink I sprayed on the target substrate SUB, the electrons in the dipoles DP may react to the light hv so that the dipole moment of the dipoles DP' may increase. As the dipole moment of the dipoles DP placed in the electric field IEL increases, the electric force applied to the dipoles DP may increase. Thus, the dipoles DP' having an increased dipole moment due to reacting to the light hv may receive a stronger force from the electric field IEL. Accordingly, the alignment reactivity of the dipoles DP can be improved, and as a result, the degree of alignment of the dipoles DP can be improved.

The temperature control device 200 may control the temperature of a solvent SV' sprayed on the target substrate SUB during the alignment of the dipoles DP and the application of the light hv to the dipoles DP. The temperature of the solvent SV' may be indirectly controlled by controlling the temperature of the target substrate SUB.

When the ink I is sprayed onto the target substrate SUB, the heater 210 of the temperature control device 200 may generate the first heat H1 to raise the temperature of the target substrate SUB. As the target substrate SUB is heated, the solvent SV' of the ink I sprayed on the target substrate SUB may have a second temperature, which is higher than the first temperature. As the temperature of the solvent SV' increases, the viscosity of the solvent SV' may decrease, and thus, the solvent SV' may have a second viscosity, which is lower than the first viscosity. Accordingly, the viscosity of the solvent SV' may be lowered by heating the target substrate SUB by using the temperature control device 200 to raise the temperature of the solvent SV'. As mentioned above, the dipoles DP' dispersed in the solvent SV' having the second viscosity may rotate or move (e.g., flow) more easily than the dipoles DP dispersed in the solvent SV having the first viscosity (e.g., the solvent SV in, for example, FIG. 21) in response to the same electrical force.

Therefore, when the viscosity of the solvent SV' is reduced, the movement or rotation of the dipoles DP can be facilitated (e.g., improved), and as a result, the degree of alignment of the dipoles DP can be improved.

When the light hv is irradiated onto the target substrate SUB and the target substrate SUB is heated by the heater 210, the temperature of the target substrate SUB may be raised too much (e.g., too excessively). If the temperature of the target substrate SUB increases too much, the temperature of the solvent SV sprayed on the target substrate SUB may also increase so that the solvent SV may be dried. If the solvent SV dries, the bonding force between the dipoles DP and the first and second electrodes 21 and 22 may increase, and as a result, the alignment of the dipoles DP may not be facilitated (e.g., the dipoles DP may be locked into position prematurely). Thus, the temperature control device 200 may raise the temperature of the solvent SV of the ink I sprayed on the target substrate SUB to lower the viscosity of the solvent SV but may prevent the temperature of the target substrate SUB from increasing too much to prevent the solvent SV from drying.

Thereafter, in S300 of FIG. 19, the dipoles DP are settled on the target substrate SUB by removing the solvent SV'.

Figure 23:
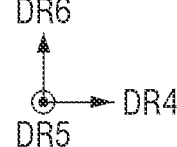

Specifically, referring to FIG. 23, the solvent SV' may be removed (e.g., evaporated) by applying the second heat H2 to the target substrate SUB by using the heat treatment unit 950. The removal of the solvent SV' may be performed by the heat treatment device 900, which is disposed in the heat treatment part HA, the second heat H2 may be applied to the target substrate SUB, and the solvent SV may be volatilized or vaporized by the second heat H2.

By removing the solvent SV from the ink I on the target substrate SUB, the flow (e.g., further flow) of the dipoles DP can be prevented, and the bonding force between the dipoles DP and the first and second electrodes 21 and 22 can be improved. As a result, the dipoles DP can be aligned on the first and second electrodes 21 and 22.

In this manner, the apparatus 1000 can align the dipoles DP on the target substrate SUB. The apparatus 1000 includes the light irradiation device 500 and can, thus, improve the alignment reactivity of the dipoles DP. Also, the apparatus 1000 includes the temperature control device 200 and can improve the degree of alignment of the dipoles DP.

FIGS. 24 through 27 are partial cross-sectional views of apparatuses for aligning dipoles according to other embodiments of the present disclosure.

Figure 24:
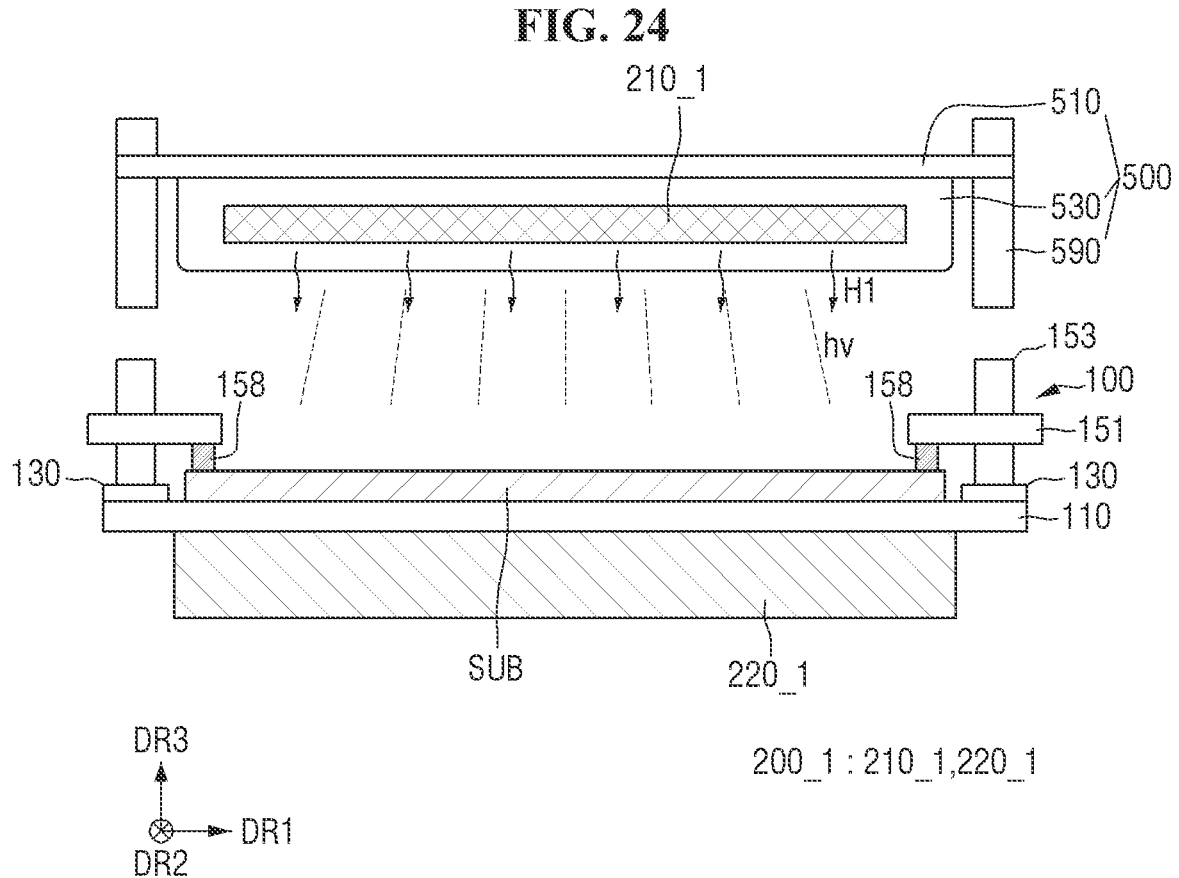

Referring to FIG. 24, a temperature control device 200_1 differs from the temperature control device 200 shown in FIG. 8 in that a heater 210_1 of the temperature control device 200_1 is mounted in the light irradiation unit 530 of the light irradiation device 500 and a cooler 220_1 is disposed below the stage 110 of the electric field forming unit 100.

For example, the heater 210_1 of the temperature control device 200_1 may be disposed above the electric field forming unit 100. The heater 210_1 may be mounted in the light irradiation unit 530 of the light irradiation device 500. The heater 210_1 may be disposed above the target substrate SUB and may heat the target substrate SUB, which is disposed below the heater 210_1, by applying first heat H1 to the top surface of the target substrate SUB to raise the temperature of the target substrate SUB.

The cooler 220_1 of the temperature control device 200_1 may be disposed below the electric field forming unit 100. The cooler 220_1 may be disposed below the stage 110 of the electric field forming unit 100 and may cool the target substrate SUB from below the target substrate SUB to lower the temperature of the target substrate SUB.

Figure 25:
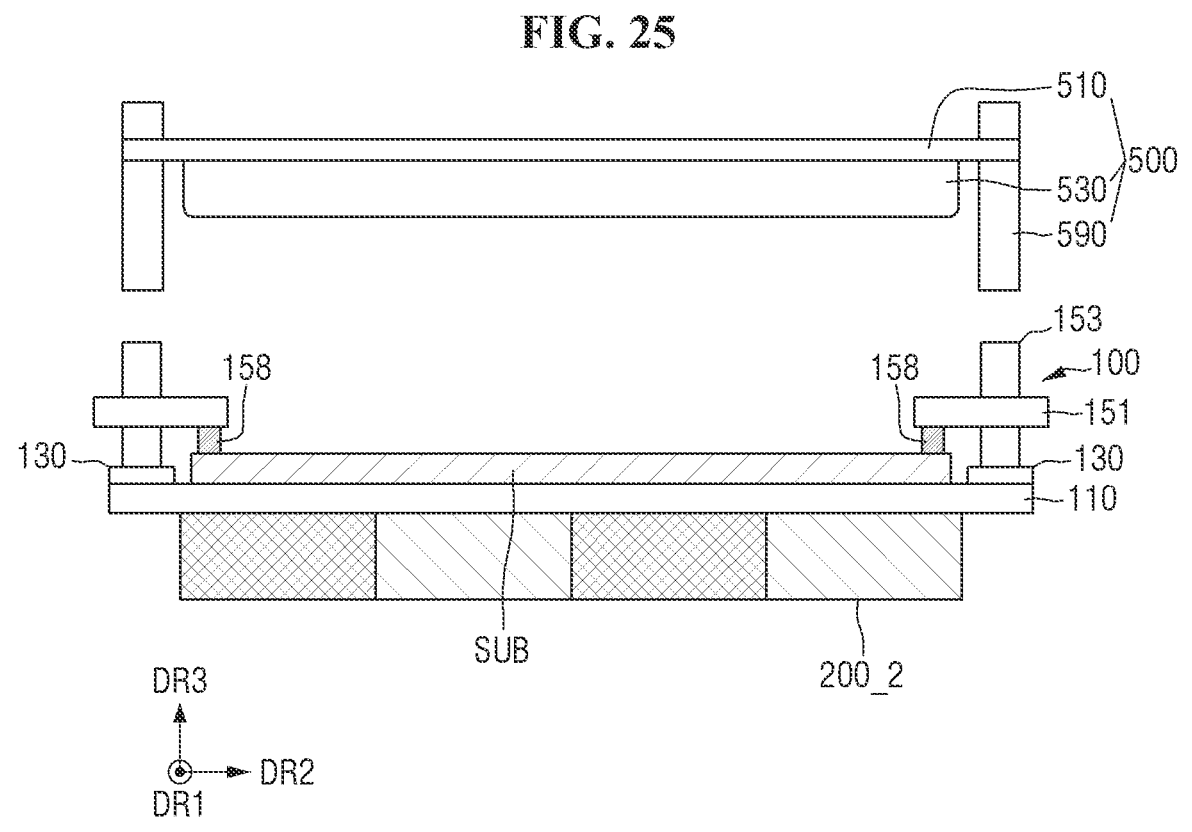

Referring to FIG. 25, a temperature control device 200_2 differs from the temperature control device 200 shown in FIG. 8 in that the temperature control device 200_2 is disposed below the stage 110 of the electric field forming unit 100 and a heater and a cooler are omitted from the temperature control device 200_2.

For example, the temperature control device 200_2 may include a plurality of thermoelectric elements. Each of the thermoelectric elements may include a plurality of semiconductors and a plurality of conductor plates. Each of the conductor plates may be heated or cooled by applying a direct current (DC) to each of the conductor plates. In this manner, the temperature of each of the conductor plates can be controlled according to the Peltier effect. Because the temperature control device 200_2, which includes the thermoelectric elements that can perform cooling or heating, is disposed below the stage 110 of the electric field forming unit 100, the temperature of a target substrate SUB can be controlled.

Figure 26:
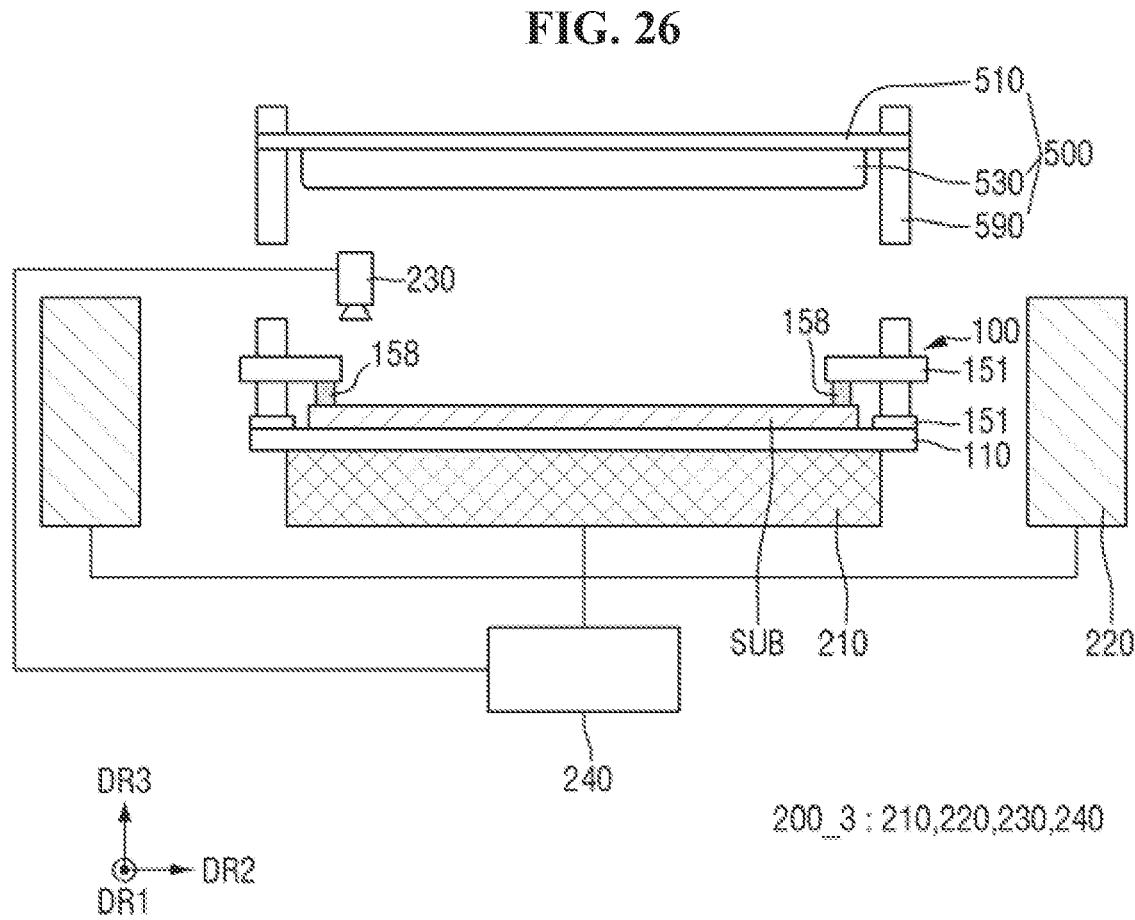

Referring to FIG. 26, a temperature control device 200_3 differs from the temperature control device 200 shown in FIG. 8 in that it further includes a temperature sensor 230 and a controller 240.

For example, the temperature control device 200_3 may include the temperature sensor 230, which detects a temperature of the top surface of the target substrate SUB, and the controller 240, which controls the temperatures of the heater 210 and the cooler 220 according to the temperature of the top surface of the target substrate SUB.

The temperature sensor 230 may be disposed above the electric field forming unit 100 and may detect the temperature of the top surface of the target substrate SUB. The temperature sensor 230 may transmit the temperature of the top surface of the target substrate SUB to the controller 240. The controller 240 may compare the temperature of the target substrate SUB, measured by the temperature sensor 230, with a reference temperature range. If the measured temperature of the target substrate SUB is outside of the reference temperature range, the controller 240 may control a temperature control unit (210 and 220) so that the temperature of the target substrate SUB is within the reference temperature range.

For example, the ink I, which includes dipoles DP and a solvent SV having the dipoles DP dispersed therein, may be sprayed onto the target substrate SUB, and the electric field forming unit 100 may move to a region where the light irradiation device 500 and the temperature control device 200_3 are disposed. When the electric field forming unit 100 moves to the region where the light irradiation device 500 and the temperature control device 200_3 are disposed, the probe unit 150 may be connected to (e.g., may be moved into contact with) the target substrate SUB to form an electric field on the target substrate SUB, the heater 210 of the temperature control device 200_3 may heat the target substrate SUB to raise the temperature of the target substrate SUB, and the light irradiation device 500 may irradiate light to the target substrate SUB. If the temperature of the target substrate SUB increases beyond the reference temperature range due to first heat H1 generated by the heater 210 and the light hv irradiated by the light irradiation device 500, the controller 240 may drive the cooler 220 to lower the temperature of the target substrate SUB. For example, because the temperature control device 200_3 further includes the temperature sensor 230 and the controller 240, the temperature of the target substrate SUB can be monitored and fed back (e.g., acted upon) in real time. Thus, the viscosity of the solvent SV can be easily controlled by controlling the temperature of the target substrate SUB, and the degree of alignment of the dipoles DP can be improved.

Figure 27:
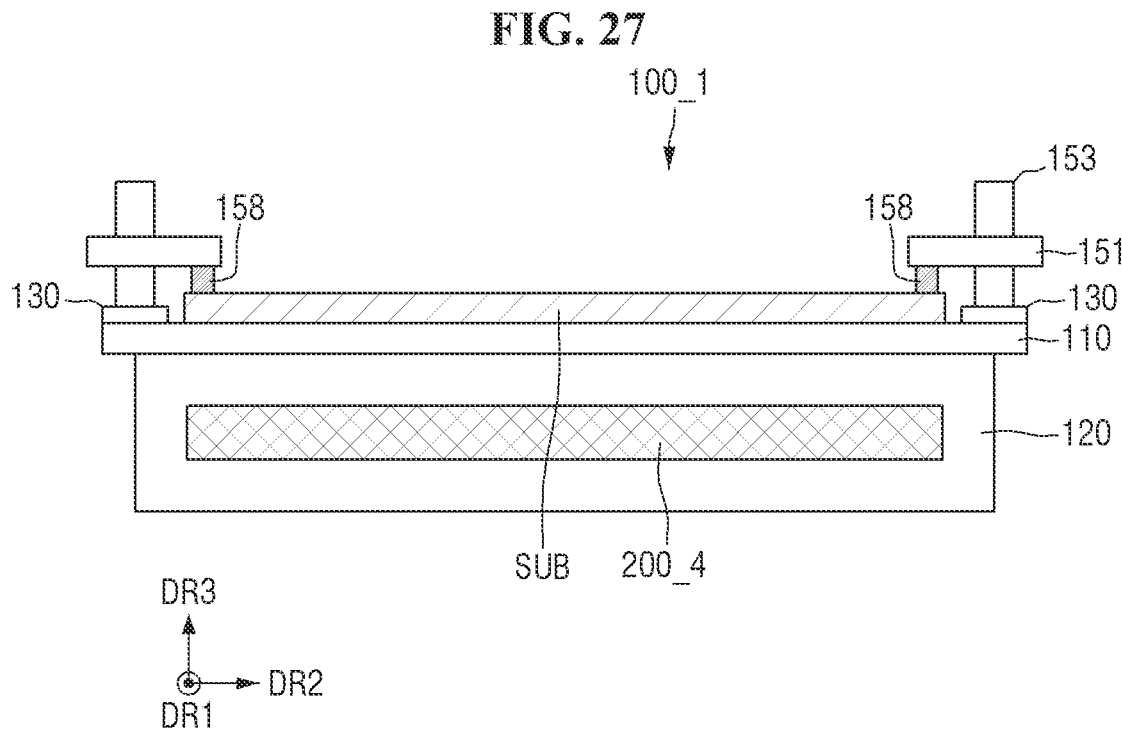

Referring to FIG. 27, a temperature control device 200_4 may be embedded in an electric field forming unit 100_1.

For example, the electric field forming unit 100_1 may further include a base frame 120. The stage 110 may be disposed on the base frame 120.

The temperature control device 200_4 may be embedded in the base frame 120 of the electric field forming unit 100_1. In this embodiment, a target substrate SUB may receive heat from, or be cooled by, the temperature control device 200_4 in the base frame 120 of the electric field forming unit 100_1. When the temperature control device 200_4 is embedded in the electric field forming unit 100_1, the temperature of the target substrate SUB can be optimally controlled while the electric field forming unit 100_1 is performing processes and/or moving from one area to another area of an apparatus 1000 for aligning dipoles.

When the temperature control device 200_4 is embedded in the electric field forming unit 100_1, heat can be transmitted to the target substrate SUB not only by the heat treatment device 900 but also by the temperature control device 200_4 while a solvent SV is being removed by a heat treatment part HA. Thus, the amount of time that it takes to remove the solvent SV may be reduced. Accordingly, the efficiency of a dipole alignment process can be improved.

Figure 28:
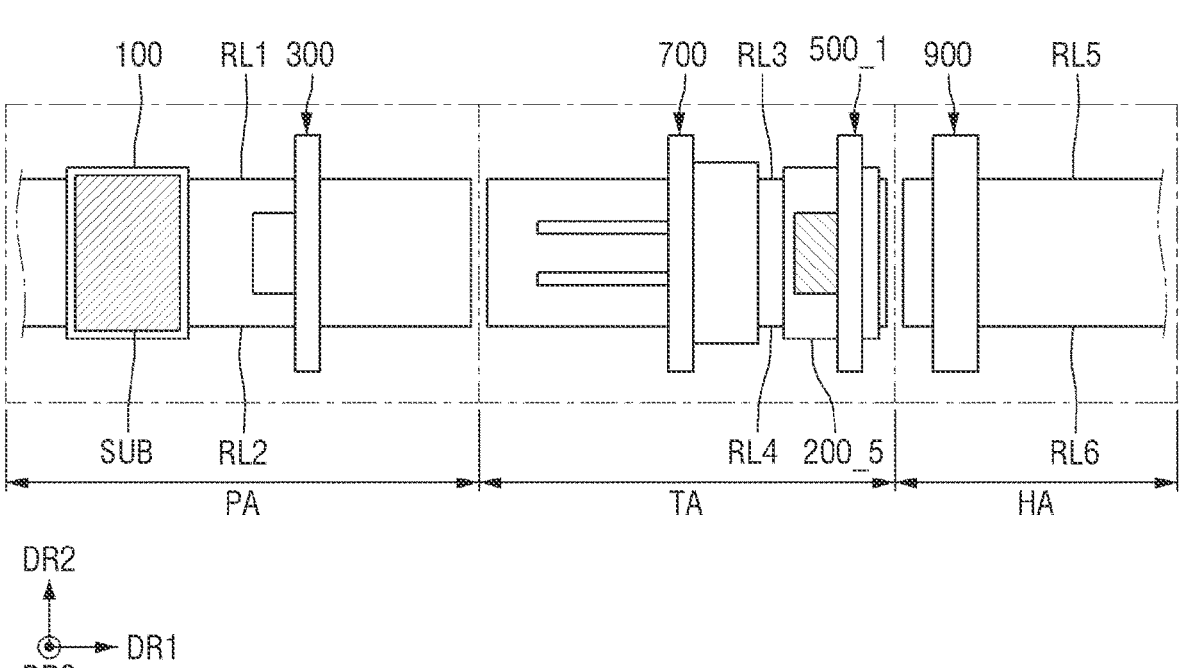
FIG. 28 is a plan view of an apparatus for aligning dipoles according to an embodiment of the present disclosure.

FIG. 28 is a plan view of an apparatus for aligning dipoles according to an embodiment of the present disclosure.

Referring to FIG. 28, an apparatus 1000_1 for aligning dipoles differs from the apparatus 1000 shown in FIG. 1 in that a light irradiation device 500_1 and a temperature control device 200_5 are disposed in the transfer part TA. The apparatus 1000_1 will hereinafter be described, focusing primarily on the differences with the apparatus 1000 shown in FIG. 1.

Because the light irradiation device 500_1 and the temperature control device 200_5 are disposed in the transfer part TA, a dipole alignment process may be performed in the transfer part TA. For example, the light irradiation device 500_1 and the temperature control device 200_5 may be disposed between the transfer unit 700 and the heat treatment device 900.

When the light irradiation device 500_1 and the temperature control device 200_5 are disposed in the transfer part TA, the target substrate SUB with the ink I sprayed thereon in the printing part PA may be moved to the transfer unit 700 together with the electric field forming unit 100, an electric field may be formed on the target substrate SUB by using the probe unit 150, and the light hv may be irradiated onto the target substrate SUB while controlling the temperature of the target substrate SUB.

Figure 29:
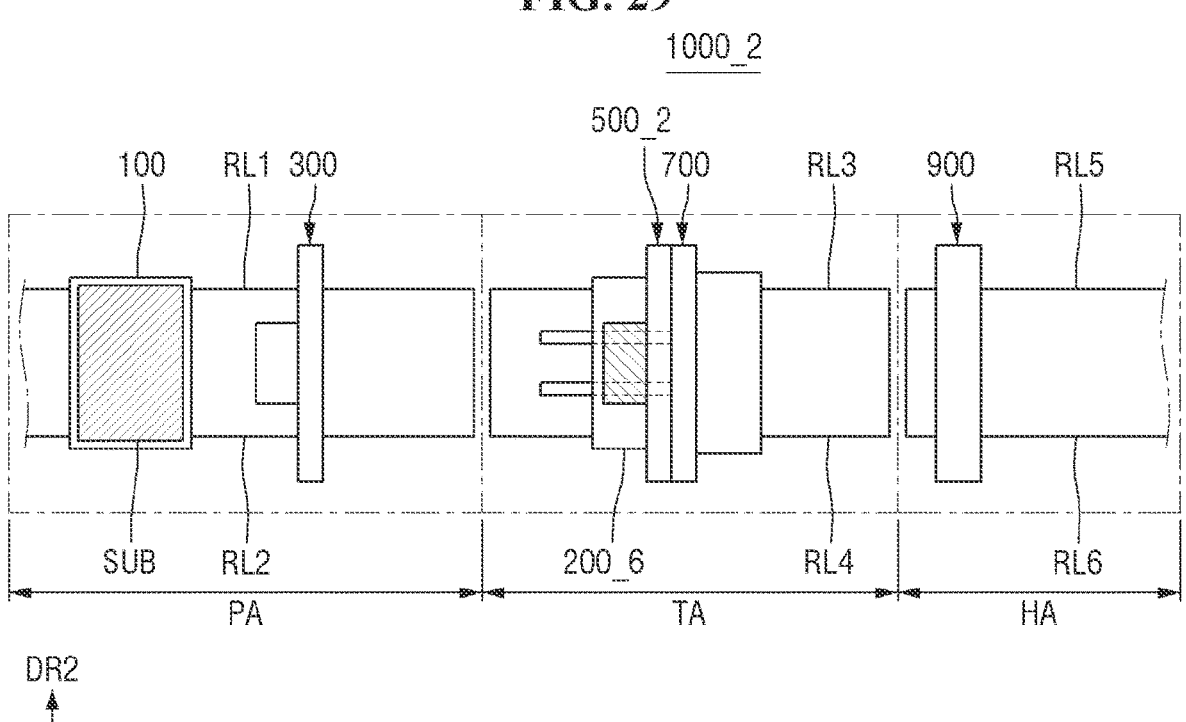
FIG. 29 is a plan view of an apparatus for aligning dipoles according to an embodiment of the present disclosure.
Figure 29:
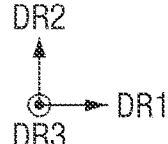
Figure 30:
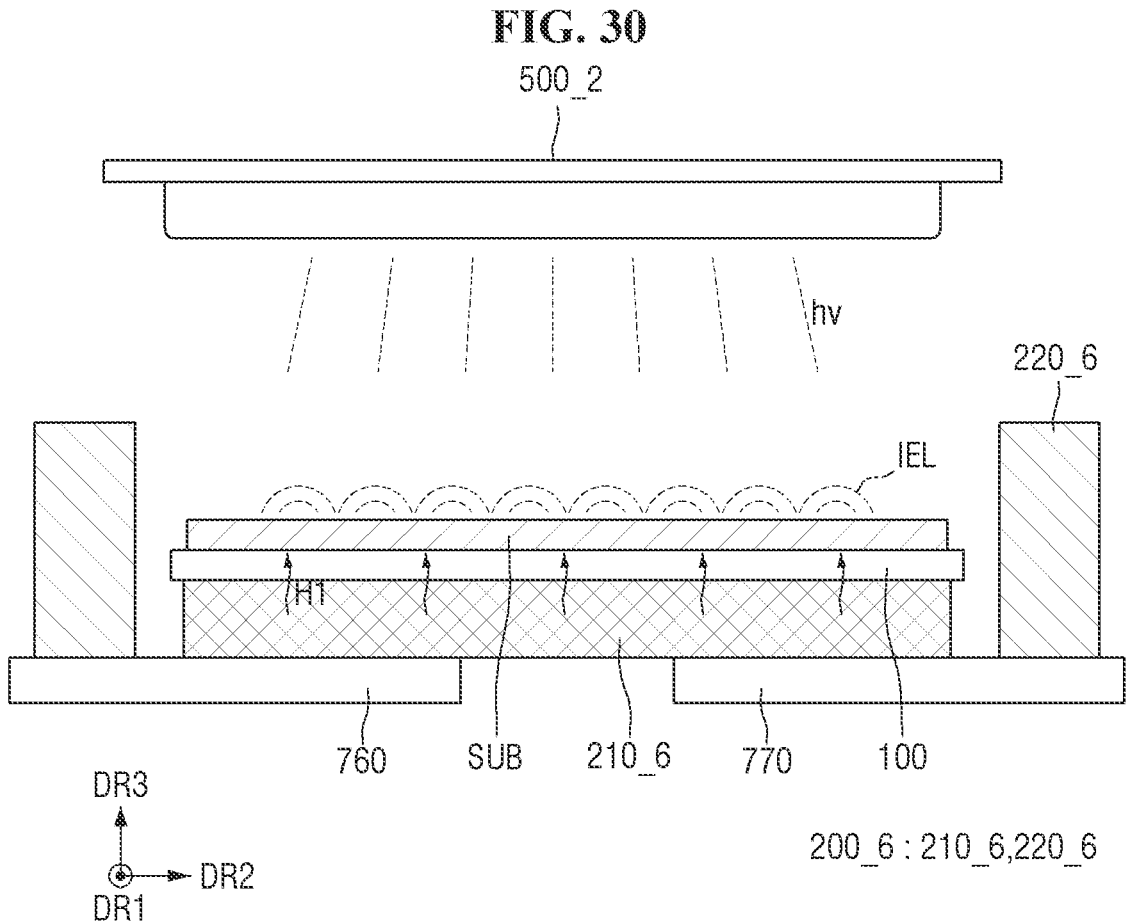
FIG. 30 illustrates the operation of a transfer unit of the apparatus shown in FIG. 29.

FIG. 29 is a plan view of an apparatus for aligning dipoles according to an embodiment of the present disclosure. FIG. 30 illustrates the operation of a transfer unit of the apparatus shown in FIG. 29.

Referring to FIGS. 29 and 30, an apparatus 1000_2 for aligning dipoles differs from the apparatus 1000_1 shown in FIG. 28 in that a light irradiation device 500_2 and a temperature control device 200_6 are disposed on the transfer unit 700 in the transfer part TA.

The light irradiation device 500_2 and the temperature control device 200_6 may be disposed on the transfer unit 700. The light irradiation device 500_2 may be disposed above first and second supports 760 and 770. A heater 210_6 and a cooler 220_6 of the temperature control device 200_6 may be disposed on the first and second supports 760 and 770.

The electric field forming unit 100 may be disposed on the heater 210_6, which is disposed on the first and second supports 760 and 770. When the electric field forming unit 100 is disposed on the heater 210_6, the electric field forming unit 100 may form an electric field IEL on the target substrate SUB, and the light irradiation device 500_2 may irradiate the light hv onto the target substrate SUB, and the temperature control device 200_6 may control the temperature of the target substrate SUB by applying the first heat H1. While the electric field forming unit 100 is being moved from the printing part PA to the heat treatment part HA, a dipole alignment process may be performed in the transfer part TA.

Figure 31:
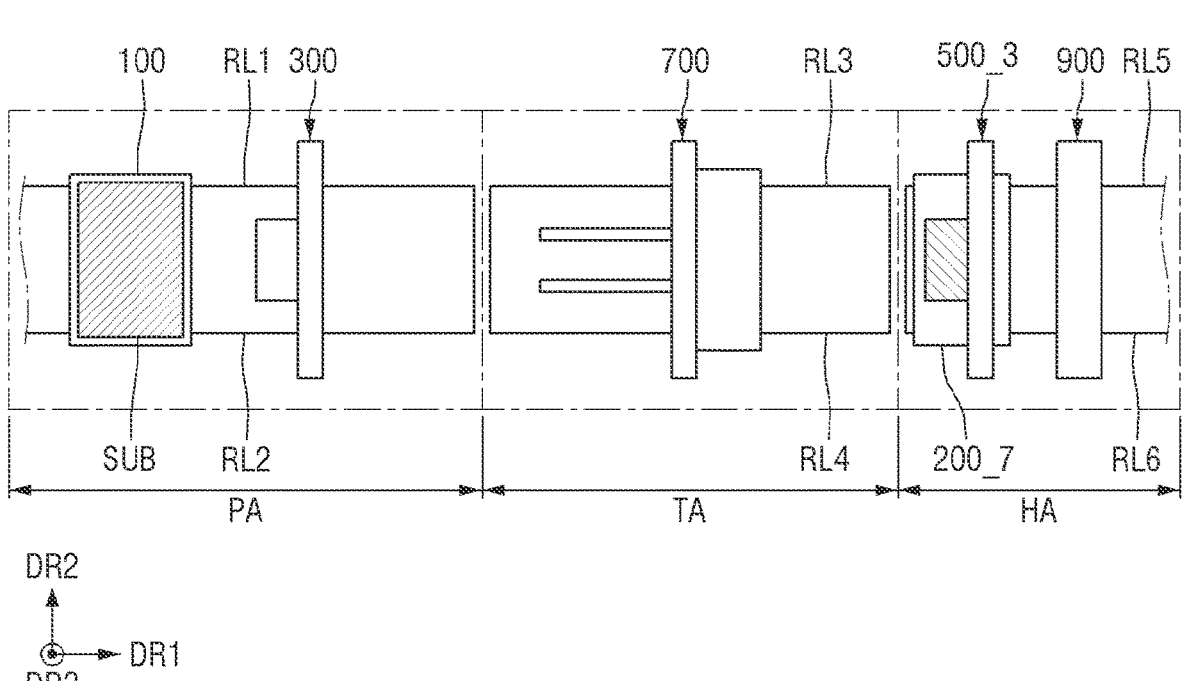
FIG. 31 is a plan view of an apparatus for aligning dipoles according to an embodiment of the present disclosure.

FIG. 31 is a plan view of an apparatus for aligning dipoles according to an embodiment of the present disclosure.

Referring to FIG. 31, an apparatus 1000_3 for aligning dipoles differs from the apparatus 1000 shown in FIG. 1 in that a light irradiation device 500_3 and a temperature control device 200_7 are disposed in a heat treatment part HA.

Because the light irradiation device 500_3 and the temperature control device 200_7 are disposed in the heat treatment part HA, a dipole alignment process may be performed in the heat treatment part HA. For example, the light irradiation device 500_3 and the temperature control device 200_7 may be disposed between the transfer unit 700 and the heat treatment device 900 in the heat treatment part HA.

When the light irradiation device 500_3 and the temperature control device 200_7 are disposed in the heat treatment part HA, the dipole alignment process may be performed in the heat treatment part HA before the electric field forming unit 100 is moved from the printing part PA to the heat treatment part HA by the transfer unit 700 and is subjected to a heat treatment process. Once the target substrate SUB, with ink I sprayed thereon, is moved to the heat treatment part HA together with the electric field forming unit 100, an electric field may be formed on the target substrate SUB by using the probe unit 150 and the light hv may be irradiated onto the target substrate SUB while controlling the temperature of the target substrate SUB. After the dipole alignment process, a heat treatment process that removes a solvent of the ink I by using the heat treatment device 900 may be performed.

Figure 32:
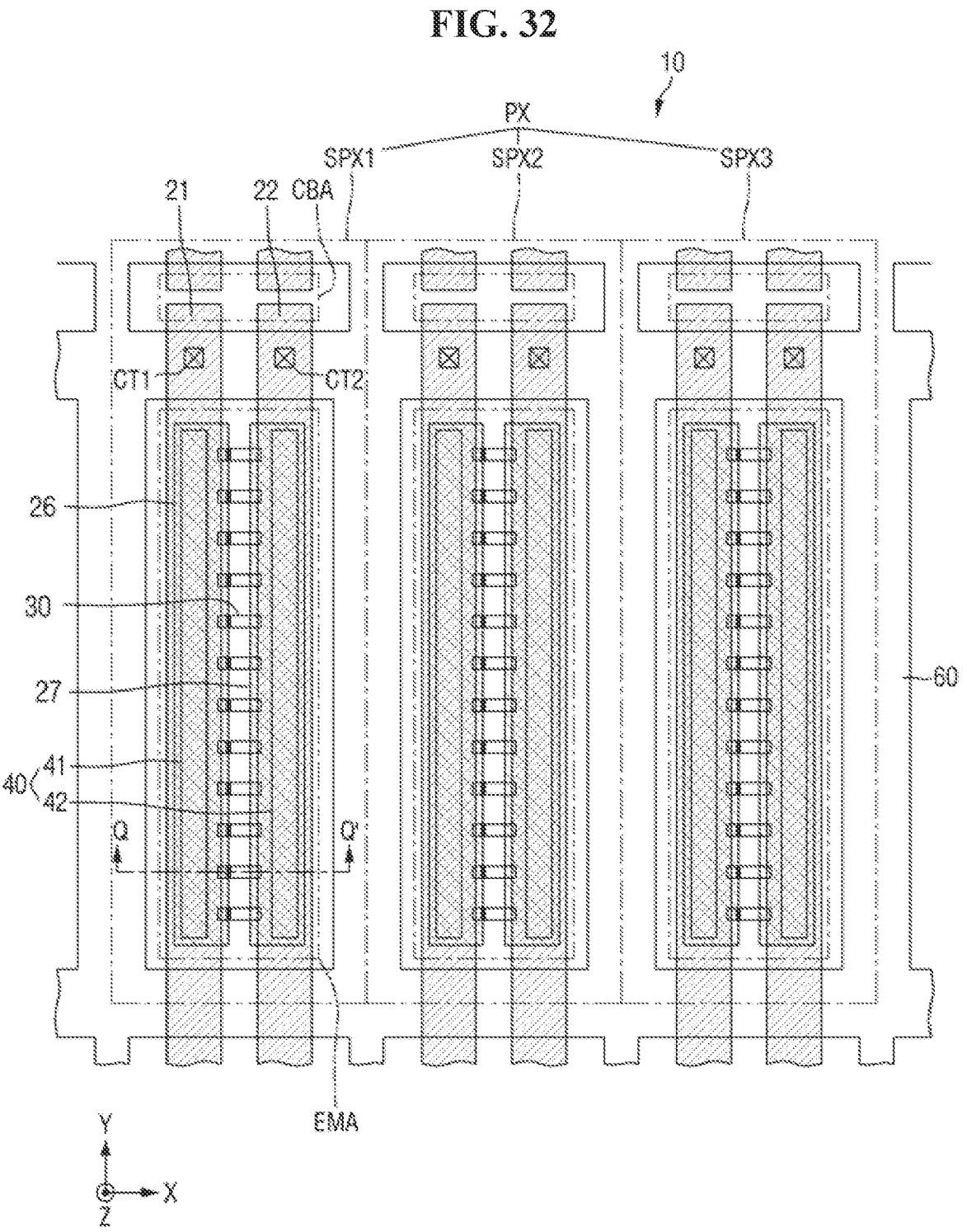
FIG. 32 is a plan view of a pixel of a display device according to an embodiment of the present disclosure.
Figure 33:
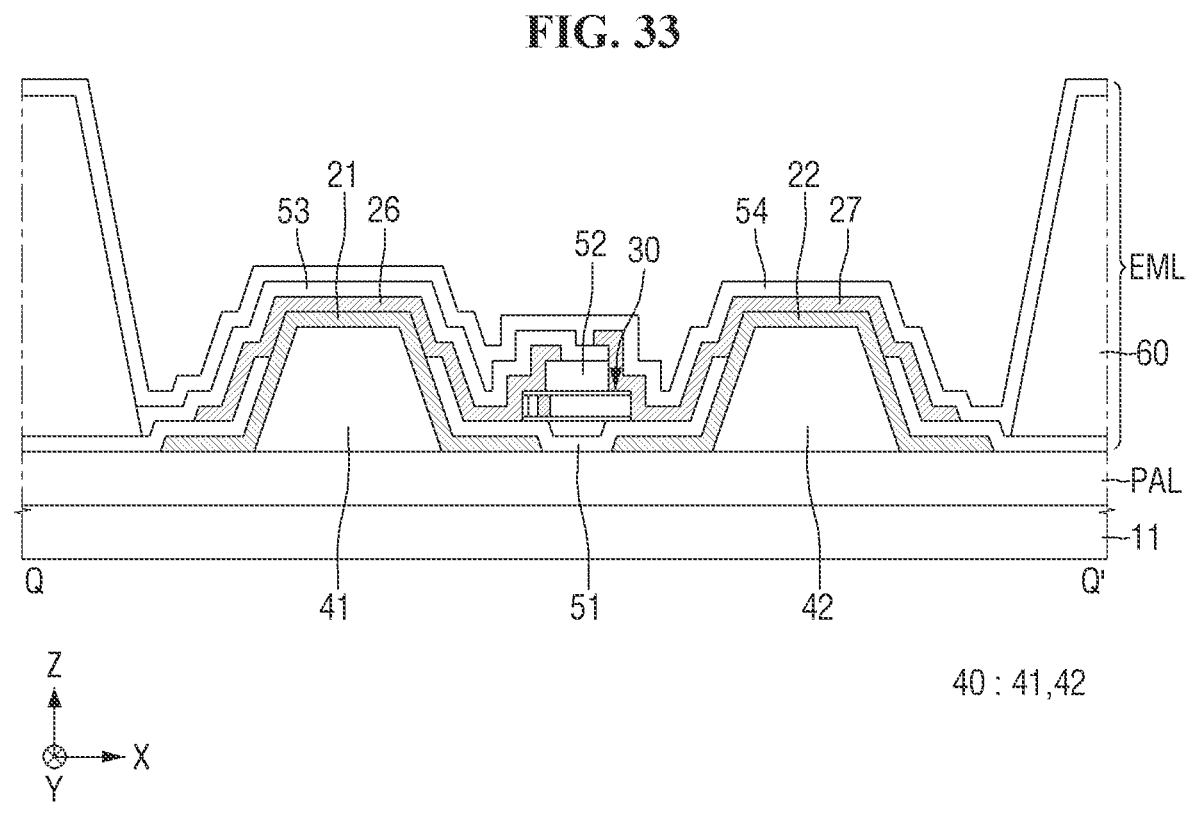

FIG. 32 is a plan view of a pixel of a display device according to an embodiment of the present disclosure. FIG. 33 is a cross-sectional view taken along the line Q-Q' of FIG. 32.

Referring to FIG. 32, a pixel PX of a display device 10 may include a plurality of subpixels SPX. For example, the pixel PX may include first, second, and third subpixels SPX1, SPX2, and SPX3. The first subpixel SPX1 may emit light of a first color, the second subpixel SPX2 may emit light of a second color, and the third subpixel SPX3 may emit light of a third color. The first, second, and third colors may be blue, green, and red, respectively. However, the present disclosure is not limited to this. In other embodiments, the first, second, and third subpixels SPX1, SPX2, and SPX3 may emit the same color light. FIG. 32 illustrates that the pixel PX includes three subpixels SPX, but the present disclosure is not limited thereto. In other embodiments, the pixel PX may include more than three subpixels SPX.

Each of the subpixels SPX may include an emission area EMA and a non-emission area. The emission area EMA may be an area at where light emitted by light-emitting elements 30 is output from, and the non-emission area may be an area at where the light emitted from the light-emitting elements 30 does not arrive at and is, thus, not output from.

The emission area EMA may include an area at where the light-emitting elements 30 are disposed and an area that surrounds (e.g., extends around a periphery of) the area at where the light-emitting elements 30 are disposed. The emission area EMA may further include an area at where the light emitted from the light-emitting elements 30 is output from after being reflected or refracted by other members.

Each of the subpixels SPX may further include a cut area CBA, which is disposed in the non-emission area. The cut area CBA may be disposed at one side, in a Y-axis direction, of the emission area EMA. The cut area CBA may be disposed between the emission areas EMA of a pair of adjacent (or neighboring) subpixels SPX in the Y-axis direction.

The emission areas EMA of the subpixels SPX may be disposed to be spaced apart from one another in an X-axis direction. Similarly, the cut areas CBA of the subpixels SPX may be disposed to be spaced apart from one another in the X-axis direction. A plurality of emission areas EMA may be disposed to be spaced apart from one another in the X-axis direction, a plurality of cut areas CBA may be disposed to be spaced apart from one another in the X-axis direction, and the plurality of emission areas EMA and the plurality of cut areas CBA may be alternately arranged in the Y-axis direction.

The cut area CBA of each of the subpixels SPX may be an area in which electrodes (21 and 22) are cut and divided between the corresponding subpixel SPX and a neighboring subpixel SPX thereof in the Y-axis direction. No light-emitting elements 30 may be disposed in the cut area CBA of each of the subpixels SPX. Parts of the electrodes (21 and 22) may be disposed in the cut area CBA of each of the subpixels SPX. The electrodes (21 and 22) disposed in each of the subpixels SPX may be cut and divided in the cut area CBA of the corresponding subpixel SPX.

Referring to FIGS. 32 and 33, the display device 10 may include, in each of the subpixels SPX, for example, in the first subpixel SPX1, a first substrate 11, a circuit element layer PAL, which is disposed on the first substrate 11, and an emission layer EML, which is disposed on the circuit element layer PAL. The emission layer EML may include first and second electrodes (21 and 22), first and second contact electrodes 26 and 27, first banks 40, a second bank 60, a plurality of insulating layers (51, 52, 53, and 54), and light-emitting elements 30.

The first substrate 11 may be an insulating substrate. The first substrate 11 may include (or may be formed of) an insulating material, such as glass, quartz, or a polymer resin. The first substrate 11 may be a rigid substrate or a flexible substrate that is bendable, foldable, or rollable.

The circuit element layer PAL may be disposed on the first substrate 11. The circuit element layer PAL may include one or more transistors and may drive the emission layer EML.

The first banks 40 may extend in the Y-axis direction in a plan view. The first banks 40 may include first and second sub-banks 41 and 42, which are disposed to be spaced apart from each other (e.g., spaced apart from each other in the X-axis direction). The gap between the first and second sub-banks 41 and 42 may provide a space in which a plurality of light-emitting elements 30 are to be disposed (e.g., arranged or aligned).

The first and second sub-banks 41 and 42 may protrude from at least a part of the top surface of the first substrate 11. Each of the protruding parts of the first and second sub-banks 41 and 42 may have inclined side surfaces. Because each of the first and second sub-banks 41 and 42 has inclined side surfaces, the first and second sub-banks 41 and 42 may change the direction of (e.g., may reflect) light that travels toward the side surfaces of each of the first and second sub-banks 41 and 42 after being emitted from the light-emitting elements 30 and may allow the light to be emitted in an upward direction (e.g., in a display direction).

The first and second electrodes 21 and 22 may be disposed on the first and second sub-banks 41 and 42, respectively. The first and second electrodes 21 and 22 may be disposed to be spaced apart from each other.

The first and second electrodes 21 and 22 may extend in the Y-axis direction in a plan view. The first and second electrodes 21 and 22 may be disposed to be spaced apart from, and face, each other in the X-axis direction.

The first electrode 21 may extend in the Y-axis direction in a plan view and overlap a part of the second bank 60 that extends in the X-axis direction X. The first electrode 21 may be electrically connected to the circuit element layer PAL through a first contact opening (e.g., a first contact hole) CT1.

The second electrode 22 may extend in the Y-axis direction in a plan view to overlap with the part of the second bank 60 that extends in the X-axis direction X. The second electrode 22 may be electrically connected to the circuit element layer PAL through a second contact opening (e.g., a second contact hole) CT2.

A cut area CBA may be disposed between the emission areas EMA of the first subpixel SPX1 and a neighboring subpixel SPX of the first subpixel SPX1 in the Y-axis direction. In the cut area CBA, the first and second electrodes 21 and 22 may be separate from first and second electrodes 21 and 22 of the neighboring subpixel SPX.

The first and second electrodes 21 and 22 may be electrically connected to the light-emitting elements 30, and voltages (e.g., predetermined voltages) may be applied to the first and second electrodes 21 and 22 so that the light-emitting elements may emit light. For example, a plurality of electrodes (21 and 22) may be electrically connected to the light-emitting elements 30 via contact electrodes (26 and 27), which will be described in more detail below, and electrical signals applied to the electrodes (21 and 22) may be transmitted to the light-emitting elements 30 via the contact electrodes (26 and 27).

A first insulating layer 51 may be disposed on the electrodes (21 and 22). The first insulating layer 51 may be disposed on the first and second electrodes 21 and 22 to expose at least parts of the first and second electrodes 21 and 22. The first insulating layer 51 may protect the first and second electrodes 21 and 22 and may insulate the first and second electrodes 21 and 22 from each other. The first insulating layer 51 may prevent the light-emitting elements 30, which are disposed on the first insulating layer 51, from being damaged by directly contacting other elements.

The second bank 60 may be disposed on the first insulating layer 51. The second bank 60 may include portions that extend in the X-axis direction and portions that extend in the Y-axis direction and may have a lattice pattern. The second bank 60 may be formed to have a greater height than the first banks 40. The second bank 60 may prevent (or substantially prevent) ink from spilling over to other subpixels SPX during the fabrication of the display device 10.

The light-emitting elements 30 may be disposed on the first insulating layer 51 and between the electrodes (21 and 22). The light-emitting elements 30 may extend in one direction. The direction in which the light-emitting elements 30 extend may substantially form a right angle with the direction in which the electrodes (21 and 22) extend.

A second insulating layer 52 may be disposed, in part, on the light-emitting elements 30, which are disposed between the first and second electrodes 21 and 22. The second insulating layer 52 may be disposed to surround parts of outer surfaces of (e.g., to partially surround outer surfaces of) each of the light-emitting elements 30. The second insulating layer 52 may be disposed on the light-emitting elements 30 but may expose both end portions of each of the light-emitting elements 30. The second insulating layer 52 may protect the light-emitting elements 30 and may fix the light-emitting elements 30 during the fabrication of the display device 10.

The first and second contact electrodes 26 and 27 may be disposed on the second insulating layer 52. The first and second contact electrodes 26 and 27 may extend in one direction in a plan view. The first and second contact electrodes 26 and 27 may extend in the Y-axis direction. The first and second contact electrodes 26 and 27 may be disposed to be spaced apart from, and face, each other in the X-axis direction.

The first and second contact electrodes 26 and 27 may contact the light-emitting elements 30 and the electrodes (21 and 22). The first contact electrode 26 may be disposed on the first electrode 21, and the second contact electrode 27 may be disposed on the second electrode 22. The first and second contact electrodes 26 and 27 may contact first and second end portions, respectively, of each of the light-emitting elements 30 and may be disposed to cover parts of the top surfaces of (e.g., may partially cover top surfaces of) the first and second electrodes 21 and 22.

The first end portions of the light-emitting elements 30, exposed by the second insulating layer 52, may be electrically connected to the first electrode 21 via the first contact electrode 26, and the second end portions of the light-emitting elements 30, exposed by the second insulating layer 52, may be electrically connected to the second electrode 22 via the second contact electrode 27.

A third insulating layer 53 may be disposed on the first contact electrode 26. The third insulating layer 53 may electrically insulate the first and second contact electrodes 26 and 27 from each other. The third insulating layer 53 may be disposed to cover the first contact electrode 26 but may not be disposed on the second end portions of the light-emitting elements 30 so that the light-emitting elements 30 may contact the second contact electrode 27.

The second contact electrode 27 may be disposed on the second electrode 22, the second insulating layer 52, and the third insulating layer 53. The second contact electrode 27 may contact the second end portions of the light-emitting elements 30 and an exposed part of the top surface of the second electrode 22. The second end portions of the light-emitting elements 30 may be electrically connected to the second electrode 22 via the second contact electrode 27.

A fourth insulating layer 54 may be disposed on the entire first substrate 11. The fourth insulating layer 54 may protect the elements disposed on the first substrate 11 from an external environment.

The first, second, third, and fourth insulating layers 51, 52, 53, and 54 may include an inorganic insulating material or an organic insulating material. For example, the first, second, third, and fourth insulating layers 51, 52, 53, and 54 may include an inorganic insulating material, such as silicon oxide ($SiO_x$), silicon nitride ($SiN_x$), silicon oxynitride ($SiO_xN_y$), aluminum oxide ($AlO_x$), or aluminum nitride (AlN), but the present disclosure is not limited thereto. In another example, the first, second, third, and fourth insulating layers 51, 52, 53, and 54 may include an organic insulating material, such as an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the present disclosure is not limited to these examples.

Figure 34:
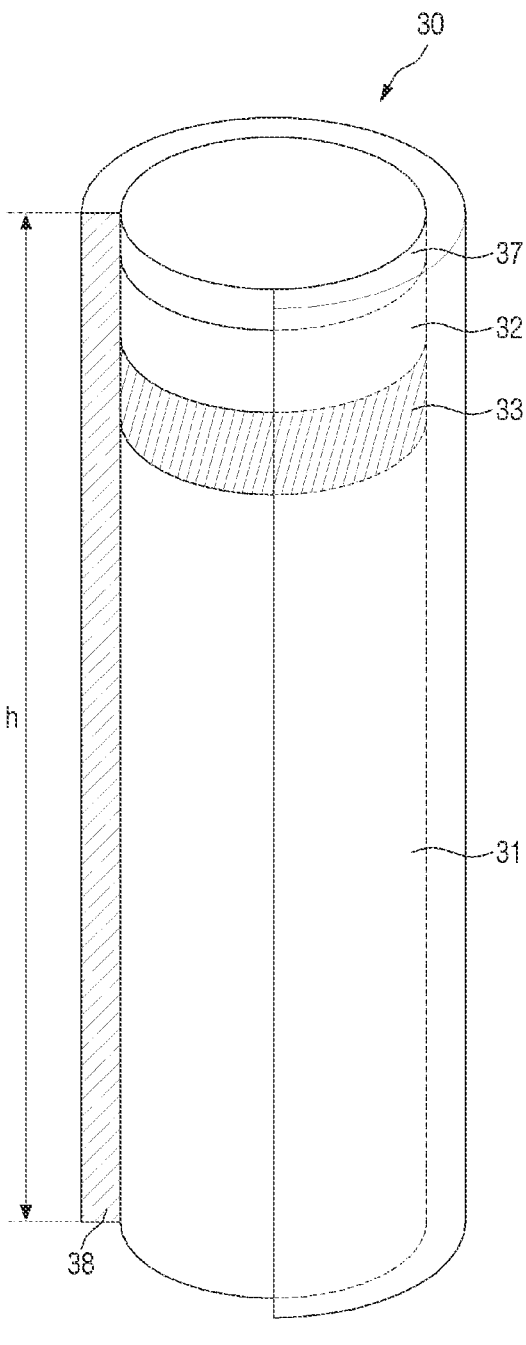
FIG. 34 is a perspective view of a light-emitting element according to an embodiment of the present disclosure.

FIG. 34 is a perspective view of a light-emitting element according to an embodiment of the present disclosure.

Referring to FIG. 34, a light-emitting element 30 may be a light-emitting diode (LED), for example, an inorganic LED (ILED) having a size in a range of several micrometers or nanometers and including an inorganic material.

The light-emitting element 30 may include semiconductor layers that are doped with impurities of an arbitrary conductivity type (e.g., a p-type or an n-type). The semiconductor layers may receive electrical signals from an external power source and may then emit light of in a wavelength range.

The light-emitting element 30 may include a first semiconductor layer 31, a second semiconductor layer 32, an active layer 33, an electrode layer 37, and an insulating film 38.

The first semiconductor layer 31 may include, for example, an n-type semiconductor having a first conductivity type. The first semiconductor layer 31 may be doped with a first conductivity-type dopant, and the first conductivity-type dopant may be, for example, Si, Ge, or Sn. For example, the first semiconductor layer 31 may be n-GaN doped with n-type Si.

The second semiconductor layer 32 may be disposed to be spaced apart from the first semiconductor layer 31. The second semiconductor layer 32 may include, for example, a p-type semiconductor having a second conductivity type. The first semiconductor layer 31 may be doped with a second conductivity-type dopant, and the second conductivity-type dopant may be, for example, Mg, Zn, Ca, Se, or Ba. For example, the first semiconductor layer 31 may be p-GaN doped with p-type Mg.

The active layer 33 may be disposed between the first and second semiconductor layers 31 and 32. The active layer 33 may include a material having a single or multiple quantum well structure. In response to electrical signals being applied thereto via the first and second semiconductor layers 31 and 32, the active layer 33 may emit light by combining electron-hole pairs. However, the present disclosure is not limited to this. In other embodiments, the active layer 33 may have a structure in which semiconductor materials with large band gap energy and a semiconductor materials with small band gap energy are alternately stacked and may include group-III to group-V semiconductor materials depending on the wavelength range of light to be emitted.

Light may be emitted from the active layer 33 not only through outer surfaces of the light-emitting element 30 in the length direction of the light-emitting element 30 but also through the side surface of the light-emitting element 30. The direction in which light is emitted from the active layer 33 is not particularly limited.

The electrode layer 37 may be disposed on the second semiconductor layer 32. The electrode layer 37 may be an ohmic contact electrode, but the present disclosure is not limited thereto. In other embodiments, the electrode layer 37 may be a Schottky contact electrode.

The electrode layer 37 may reduce the resistance between the light-emitting element 30 and an electrode (or a contact electrode) when the light-emitting element is electrically connected to the electrode (or the contact electrode). The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and indium tin-zinc oxide (ITZO). The electrode layer 37 may include a semiconductor material doped with an n- or p-type dopant.

The insulating film 38 may be disposed to surround outer surfaces of the first and second semiconductor layers 31 and 32, the active layer 33, and the electrode layer 37. For example, the insulating film 38 may be disposed to surround at least the outer surface of the active layer 33 and may extend in the same direction as the light-emitting element 30. The insulating film 38 may protect the other elements of the light-emitting element 30. For example, the insulating film 38 may be formed to surround (or cover) the side surfaces of the other elements of the light-emitting element 30 but may expose both ends, in the length direction, of the light-emitting element 30. The insulating film 38 may include a material having insulating properties. The insulating film 38 can prevent (or substantially prevent) an electrical short circuit that may occur when the active layer 33 is placed in contact with an electrode that transmits an electrical signal to the light-emitting element 30. Also, the insulating film 38 protects the outer surface of the light-emitting element 30 including the active layer 33 and, thus, may prevent a decrease in the emission efficiency of the light-emitting element 30.

In some embodiments, the insulating film 38 (e.g., the outer surface of the insulating film 38) may be surface-treated. The light-emitting element 30 may be sprayed and aligned while it is dispersed in an ink (e.g., in a solvent of the ink) during the fabrication of the display device 10. Here, to maintain dispersion of the light-emitting element 30 in the ink without aggregating with other light-emitting elements 30, the surface of the insulating film 38 may be hydrophobically or hydrophilically treated.

A method of fabricating a display device according to an embodiment of the present disclosure will hereinafter be described.

Figure 35:
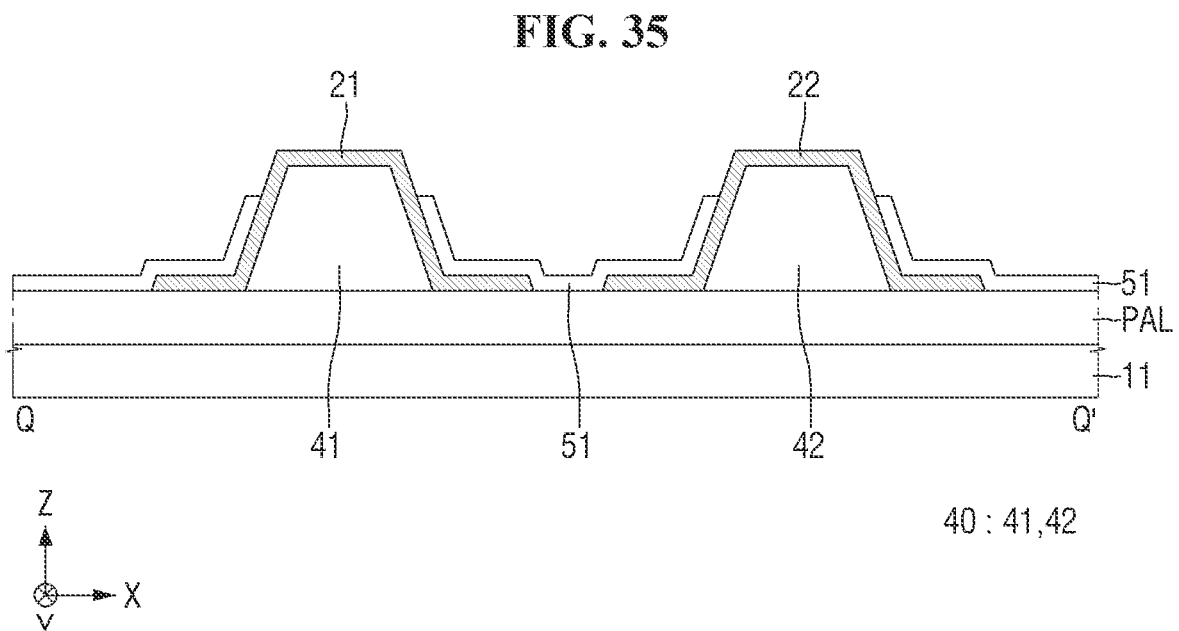
FIGS. 35 and 36 are cross-sectional views illustrating a method of fabricating a display device according to an embodiment of the present disclosure.
Figure 36:
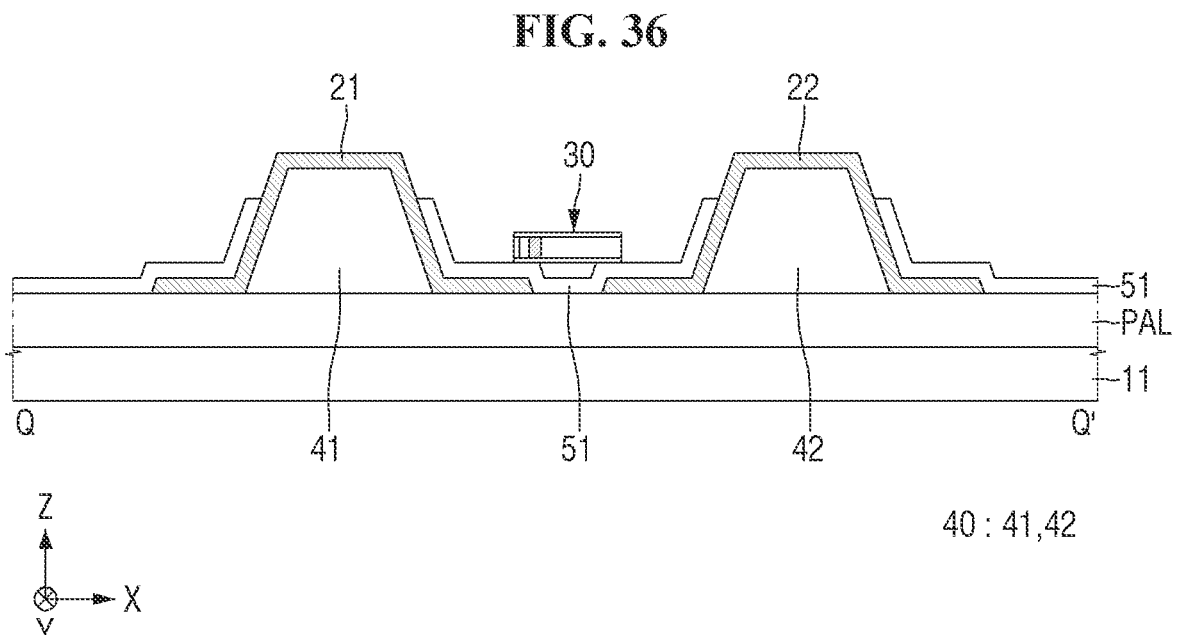

FIGS. 35 and 36 are cross-sectional views illustrating a method of fabricating a display device according to an embodiment of the present disclosure.

Referring to FIG. 35, a substrate including a first substrate 11, a circuit element layer PAL, which is disposed on the first substrate 11, first and second sub-banks 41 and 42, which are disposed on the circuit element layer PAL and spaced apart from each other, first and second electrodes 21 and 22, which are disposed on the first and second sub-banks 41 and 42, respectively, and a first insulating layer 51, which is disposed to expose at least parts (or portions) of the first and second electrodes 21 and 22, is prepared. Each of these elements of the substrate may be formed by patterning a metal, an inorganic material, or an organic material through a typical mask process Thereafter, referring to FIG. 36, light-emitting elements 30 are aligned on the first and second electrodes 21 and 22. The light-emitting elements 30, which are a type of dipole, may be aligned by the apparatus 1000 and according to a dipole alignment method of the apparatus 1000 as described above. A detailed description of the alignment of the light-emitting elements 30 will not be repeated.

Thereafter, a plurality of elements such as, for example, first and second contact electrodes 26 and 27 and second, third, and fourth insulating layers 52, 53, and 54 may be formed by additional processes, thereby fabricating a display device 10.

In this manner, the light-emitting elements 30 can be aligned between the first and second electrodes 21 and 22 with a high degree of alignment. When the degree of alignment of the light-emitting elements 30 is improved, any connection or contact defects between the first and second electrodes 21 and 22 or between the first and second contact electrodes 26 and 27 is reduced, and the reliability of each pixel PX of the display device 10 is improved.

In concluding the detailed description, those skilled in the art will appreciate that many variations and modifications can be made to the embodiments described herein without departing from the present disclosure. Therefore, the disclosed embodiments of the disclosure are to be understood in a generic and descriptive sense and not for purposes of limitation.

What is claimed is:

1. A method of aligning dipoles, the method comprising:
spraying ink, comprising a solvent and dipoles dispersed in the solvent, onto a target substrate; and
aligning the dipoles on the target substrate by concurrently:
forming an electric field on the target substrate to impart an electric force onto the dipoles;
irradiating light onto the target substrate to improve alignment reactivity of the dipoles; and
controlling a temperature of the target substrate.

2. The method of claim 1, wherein the controlling the temperature of the target substrate comprises heating the target substrate so that a temperature of the solvent sprayed on the target substrate increases and a viscosity of the solvent decreases.

3. The method of claim 1, wherein the light irradiated to the target substrate has a wavelength that increases a dipole moment of the dipoles.

4. The method of claim 3, wherein the light has a wavelength range comprising the wavelength corresponding to a type of the dipoles.

5. The method of claim 1, further comprising removing the solvent sprayed on the target substrate and fixing the dipoles on the target substrate.

6. The method of claim 1, wherein the aligning of the dipoles on the target substrate comprises selectively heating a region of the target substrate so that a temperature of the solvent sprayed on the region of the target substrate increases and a viscosity of the solvent decreases.

7. The method of claim 1, wherein the irradiating of light onto the target substrate comprises selectively irradiating light onto a region of the target substrate to increase a dipole moment of the dipoles on the region of the target substrate.

8. The method of claim 7, wherein the light is irradiated onto a first area and a second area of the target substrate while the temperature of the first area and a third area of the target substrate is controlled.

9. The method of claim 1, wherein the light is selectively irradiated onto a region of the target substrate while the temperature of the region of the target substrate is selectively controlled and while the electric field is formed on the target substrate.

\* \* \* \* \*